(12) United States Patent
Lee et al.

(10) Patent No.: US 11,502,028 B2
(45) Date of Patent: Nov. 15, 2022

(54) SEMICONDUCTOR PACKAGE INCLUDING A WIRE AND A METHOD OF FABRICATING THE SEMICONDUCTOR PACKAGE

(71) Applicant: SK hynix Inc., Icheon-si Gyeonggi-do (KR)

(72) Inventors: Chae Sung Lee, Icheon-si Gyeonggi-do (KR); Jong Hoon Kim, Icheon-si Gyeonggi-do (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 17/175,914

(22) Filed: Feb. 15, 2021

(65) Prior Publication Data

US 2022/0108942 A1    Apr. 7, 2022

(30) Foreign Application Priority Data

Oct. 6, 2020 (KR) .................. 10-2020-0128588

(51) Int. Cl.
| | | |
|---|---|---|
| H01L 21/00 | (2006.01) | |
| H01L 23/02 | (2006.01) | |
| H01L 25/065 | (2006.01) | |
| H01L 23/498 | (2006.01) | |
| H01L 23/31 | (2006.01) | |

(Continued)

(52) U.S. Cl.
CPC .... *H01L 23/49811* (2013.01); *H01L 21/4889* (2013.01); *H01L 21/561* (2013.01); *H01L 21/78* (2013.01); *H01L 23/3121* (2013.01); *H01L 23/3185* (2013.01); *H01L 25/0657* (2013.01); *H01L 25/50* (2013.01); *H01L 24/16* (2013.01); *H01L 2224/16145* (2013.01); *H01L 2224/16155* (2013.01); *H01L 2225/06513* (2013.01);

(Continued)

(58) Field of Classification Search
CPC ....... H01L 25/0657; H01L 2224/48091; H01L 24/48; H01L 2224/48227; H01L 2225/0651; H01L 23/552; H01L 2225/06589; H01L 2924/19107
See application file for complete search history.

(56) References Cited

U.S. PATENT DOCUMENTS

| | | | | |
|---|---|---|---|---|
| 8,189,717 B2* | 5/2012 | Khlat | ...................... | H03D 3/002 |
| | | | | 375/350 |
| 9,373,605 B1* | 6/2016 | Wang | ................ | H01L 23/49822 |

(Continued)

FOREIGN PATENT DOCUMENTS

| | | |
|---|---|---|
| KR | 1020120074014 A | 7/2012 |
| KR | 1020190065749 A | 6/2019 |

OTHER PUBLICATIONS

Hsiao Hsiang-Yao et al., Ultra-thin FO Package-on-Package for Mobile Application, 2019, p. 21-p. 27, IEEE 69th Electronic Components and Technology Conference (ECTC).

(Continued)

*Primary Examiner* — Bradley Smith
*Assistant Examiner* — David J Goodwin
(74) *Attorney, Agent, or Firm* — William Park & Associates Ltd.

(57) ABSTRACT

A semiconductor package is described. The semiconductor packager includes a chip stack mounted over a package substrate, a first wire disposed over the package substrate, and a molding layer surrounding the chip stack and the first wire. The first wire has an acute angle.

17 Claims, 31 Drawing Sheets

(51) Int. Cl.
*H01L 25/00* (2006.01)
*H01L 21/48* (2006.01)
*H01L 21/78* (2006.01)
*H01L 21/56* (2006.01)
*H01L 23/00* (2006.01)

(52) U.S. Cl.
CPC ............ *H01L 2225/06517* (2013.01); *H01L 2225/06589* (2013.01)

(56) References Cited

U.S. PATENT DOCUMENTS

| | | |
|---|---|---|
| 9,502,371 B2 | 11/2016 | Colosimo, Jr. et al. |
| 2012/0061816 A1* | 3/2012 | Song .................. H01L 23/3677 257/E23.079 |
| 2014/0015116 A1* | 1/2014 | Fu ........................ H01L 21/565 257/659 |
| 2015/0206865 A1* | 7/2015 | Yu .......................... H01L 24/17 257/737 |
| 2016/0358897 A1* | 12/2016 | Albers .................... H01L 28/00 |
| 2017/0018476 A1* | 1/2017 | Wang ..................... H01L 25/105 |
| 2019/0324080 A1* | 10/2019 | Si ........................... H01L 22/34 |
| 2021/0151410 A1* | 5/2021 | Hwang ............... H01L 25/0657 |

OTHER PUBLICATIONS

Ivy Qin et al., Advances in Wire Bonding Technology for 3D Die Stacking and Fan Out Wafer Level Package, 2017, p. 309-p. 1315, IEEE 67th Electronic Components and Technology Conference.

* cited by examiner

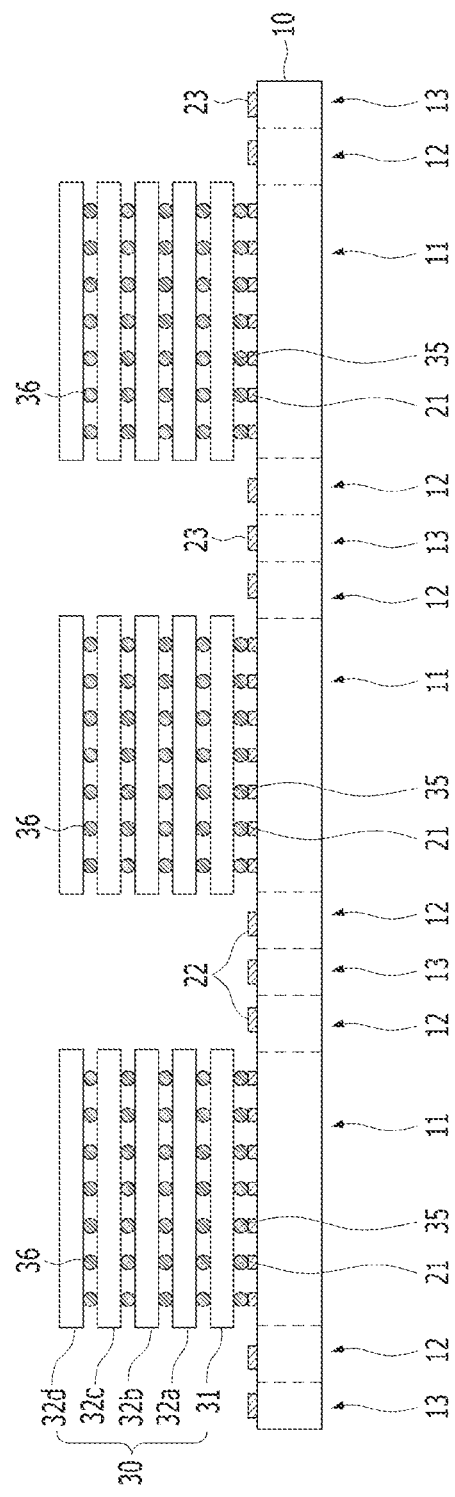

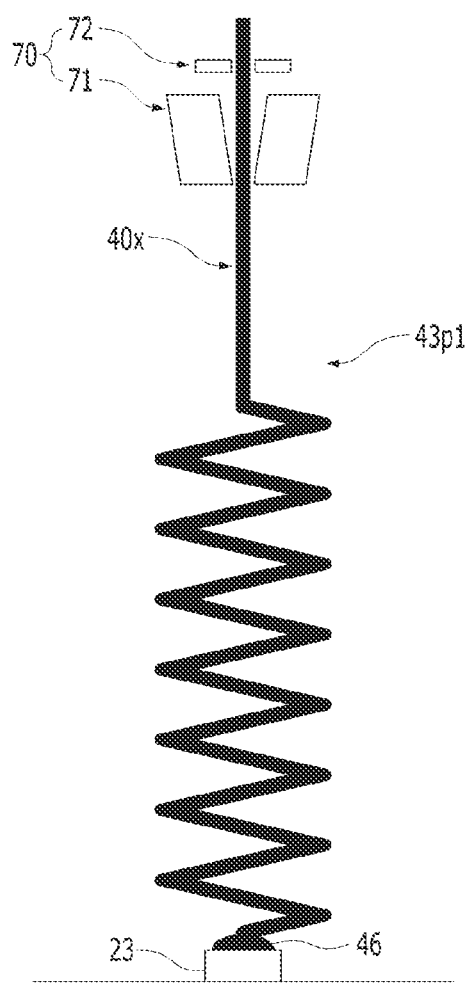

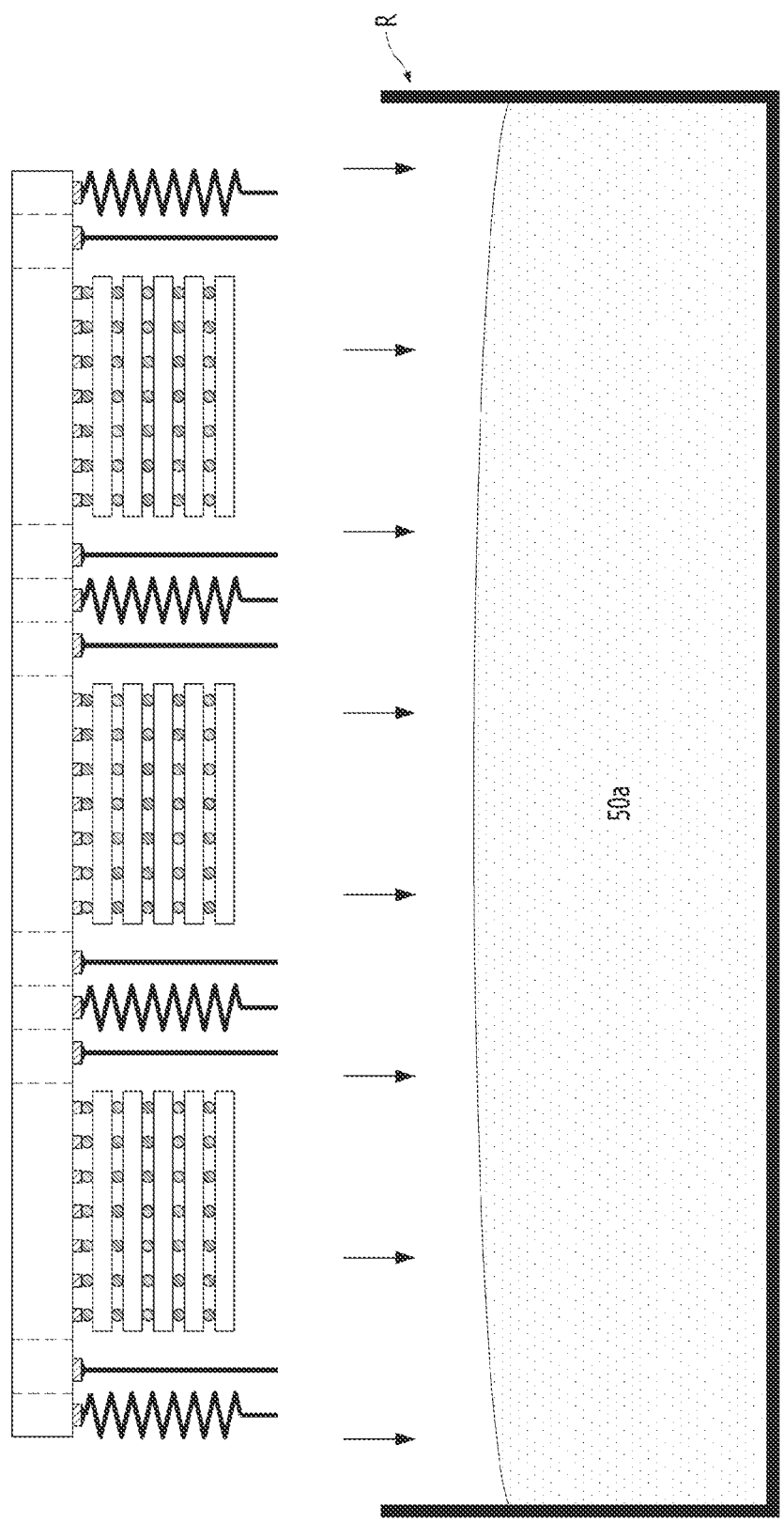

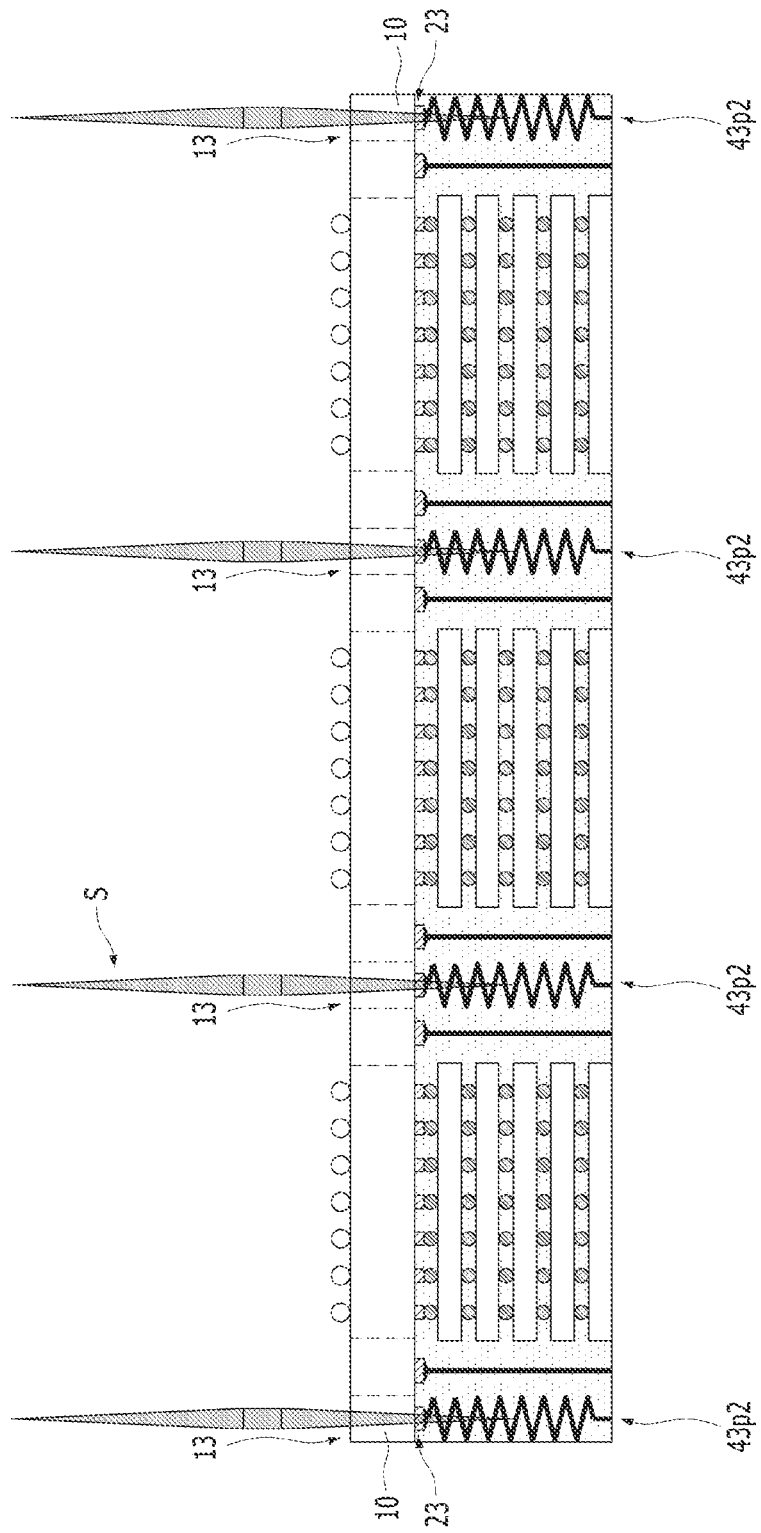

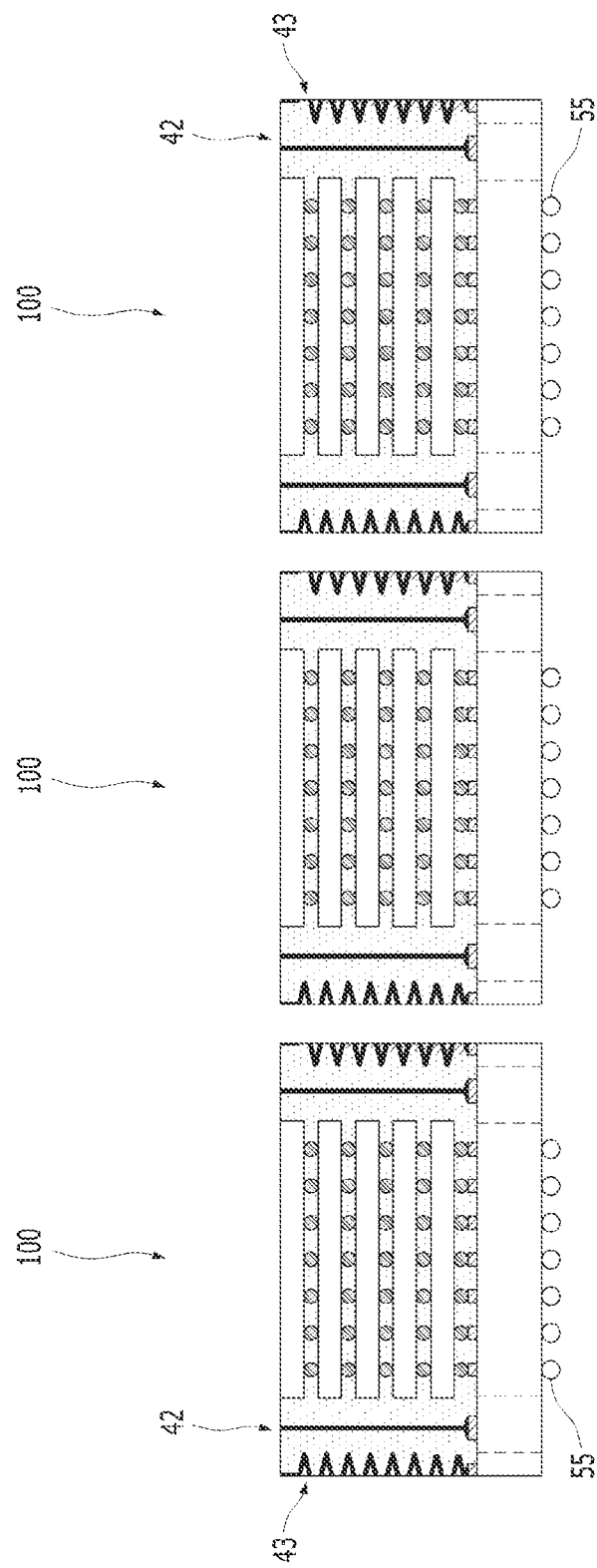

SEMICONDUCTOR PACKAGE INCLUDING A WIRE AND A METHOD OF FABRICATING THE SEMICONDUCTOR PACKAGE

CROSS-REFERENCE TO RELATED APPLICATION

This application claims priority under 35 U.S.C. § 119(a) to Korean Patent Application No. 10-2020-0128588 filed on Oct. 6, 2020, which is incorporated herein by reference in its entirety.

BACKGROUND

1. Technical Field

The present disclosure relates to a semiconductor package and a method of fabricating the semiconductor package, and more particularly, to a semiconductor package including a wire and a method of fabricating the semiconductor package.

2. Related Art

Recently, a semiconductor package in which a plurality of memory chips are stacked on a logic chip has been proposed. Accordingly, heat dissipation of the plurality of chips has emerged as an important problem. In particular, since the logic chip that generates more heat than the memory chips is disposed at the bottom, it might not be sufficiently radiated upwards, thereby deteriorating the performance of the semiconductor package and shortening a lifetime of the semiconductor package.

SUMMARY

A semiconductor package in accordance with an embodiment of the present disclosure may include a chip stack mounted over a package substrate, an outer wire disposed over the package substrate, the outer wire including a first unit outer wire, and a molding layer surrounding the chip stack and the outer wire. The first unit outer wire may include a first segment and a second segment, wherein the first segment may be in contact with the second segment to form an acute angle adjacent to a point at which the first and second segments intersect.

A semiconductor package in accordance with an embodiment of the present disclosure may include a chip stack mounted over a package substrate, a first wire disposed over the package substrate, and a molding layer surrounding the chip stack and the first wire. The first wire may have a zigzag form.

A semiconductor package in accordance with an embodiment of the present disclosure may include a package substrate having a chip area and a peripheral area surrounding the chip area, a chip stack disposed in the chip area of the package substrate, and a first wire disposed in the peripheral area of the package substrate. The first wire may include a plurality of first unit wires having a bracket shape arranged over a top surface of the package substrate in a vertical direction.

A method of fabricating a semiconductor package in accordance with an embodiment of the present disclosure may include preparing a package substrate, the package substrate including chip areas arranged in a matrix form and peripheral areas surrounding the chip areas, mounting chip stacks over the chip areas, respectively, forming preliminary outer wires surrounding the chip stacks over the peripheral areas, the preliminary outer wires having a zigzag form over a top surface of the package substrate in a vertical direction, forming a molding layer surrounding the chip stacks and the preliminary outer wires over the package substrate, and performing a sawing process to cut the package substrate and the molding layer to fabricate the semiconductor packages which are individually separated.

A method of manufacturing a semiconductor package in accordance with the present disclosure may include preparing a package substrate having chip areas and peripheral areas surrounding the chip area, mounting chip stacks in the chip areas, respectively, forming first wires having a zigzag form and second wires having a vertically uprightly erected form in the peripheral areas, forming a molding layer surrounding the chip stacks, the first wires, and the second wires over the package substrate, partially removing upper portions of the molding layer, the first wires, and the second wires, and cutting the molding layer, the first wires, and the package substrate.

BRIEF DESCRIPTION OF THE DRAWINGS

FIGS. 3A, 3B, 4A, 4B, 5A, 5B, 6A, 6B, 6C, 7A, 7B, 8A, 8B, 8C, 8D, 8E, 8F, 8G, 8H, 8I, 8J, 8K 9, 10, 11, 12, 13A, 13B, 14A, and 14B illustrate methods of fabricating semiconductor packages in accordance with embodiments of the present disclosure.

DETAILED DESCRIPTION

Figure 1A:
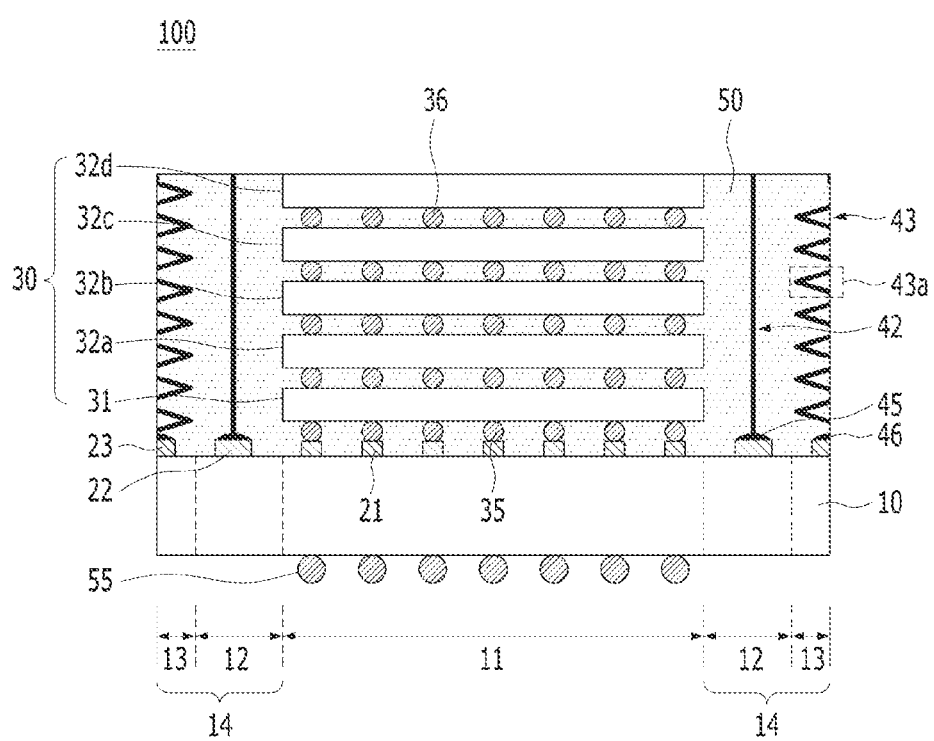
FIGS. 1A, 1B, 1C, and 1D illustrate a semiconductor package in accordance with an embodiment of the present disclosure.

Various examples and embodiments of the disclosed technology are described below in detail with reference to the accompanying drawings. The drawings might not be necessarily to scale, and in some instances, proportions of at least some structures in the drawings may be exaggerated in order to clearly illustrate certain features of the described examples or embodiments. In presenting a specific example in a drawing or description having two or more layers in a multi-layer structure, the relative positioning relationship of such layers or the sequence of arranging the layers as shown reflects a particular embodiment for the described or illustrated example and different relative positioning relationships or sequences of arranging the layers may be possible. In addition, a described or illustrated example of a multi-layer structure might not reflect all layers present in that particular multilayer structure (e.g., one or more additional layers may be present between two illustrated layers). As a specific example, when a first layer in a described or illustrated multi-layer structure is referred to as being "on" or "over" a second layer or "on" or "over" a substrate, the first layer may be directly formed on the second layer or the substrate but may also represent a structure where one or more other intermediate layers may exist between the first layer and the second layer or the substrate.

Embodiments of the present disclosure may provide a semiconductor package having improved heat dissipation capabilities.

Embodiments of the present disclosure may provide a method of fabricating a semiconductor package having improved heat dissipation capabilities.

Embodiments of the present disclosure may provide a semiconductor package including a zigzag shaped wire.

Embodiments of the present disclosure may provide a method of forming a zigzag shaped wire.

Figure 1B:
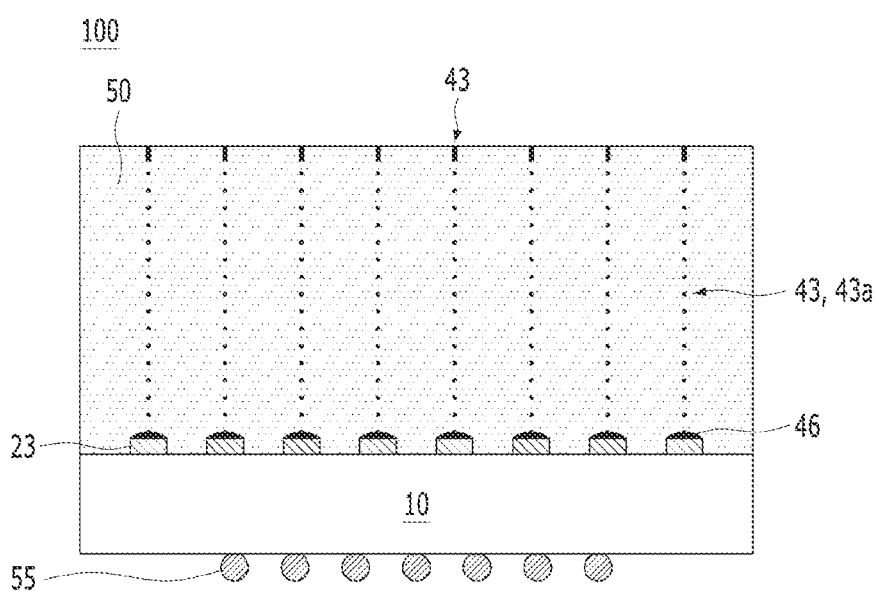
Figure 1C:
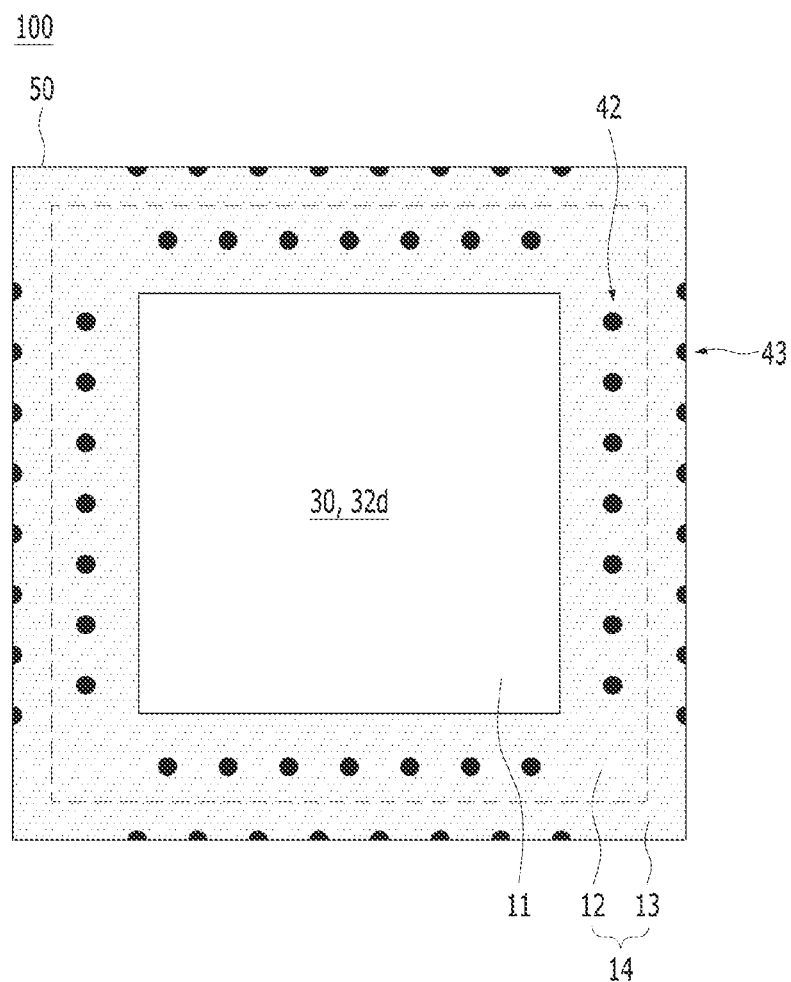
Figure 1D:
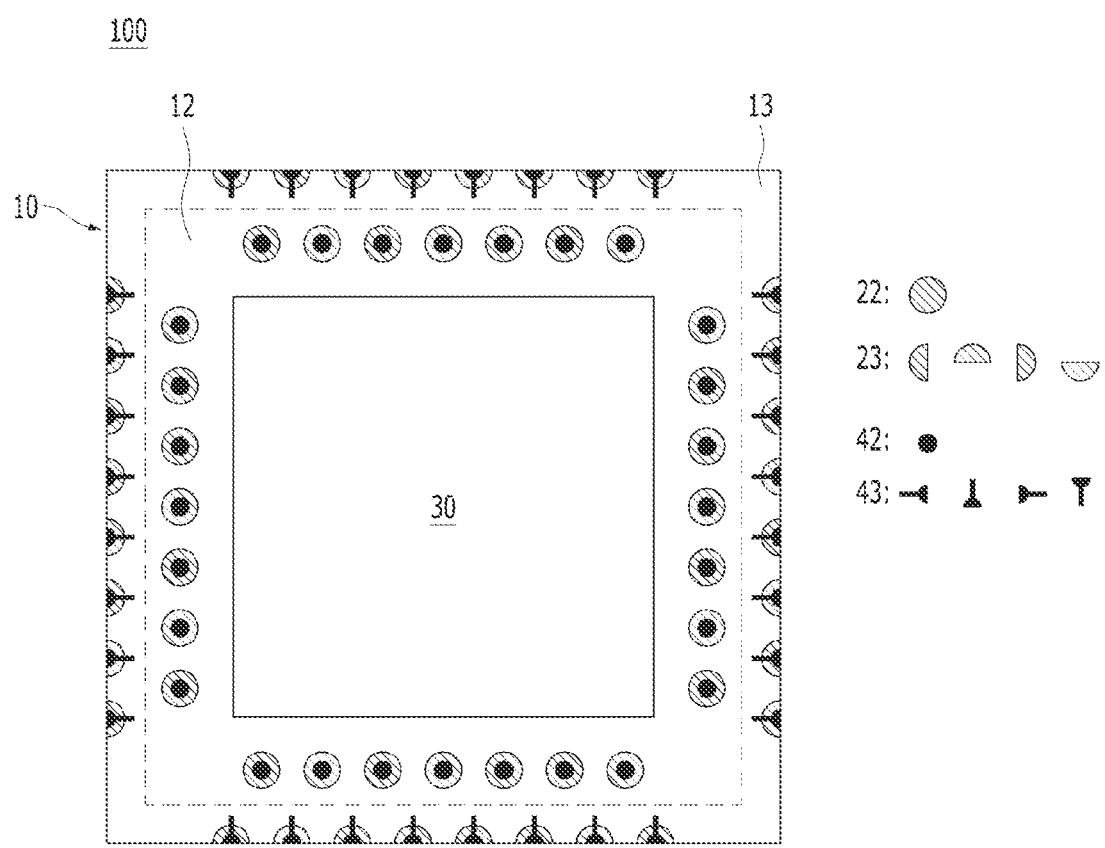

FIGS. 1A to 1D schematically illustrate a semiconductor package 100 in accordance with an embodiment of the present disclosure. FIG. 1A is a longitudinal sectional view, FIG. 1B is a side view, FIG. 1C is a top view, and FIG. 1D is a top perspective view.

Referring to FIG. 1A to 1D, the semiconductor package 100 in accordance with an embodiment of the present disclosure may include a plurality of pads 21, 22, and 23, substrate interconnectors 35, a chip stack 30, an inner wire 42 (e.g., second wire), an outer wire 43 (e.g., first wire), an inner wire base 45, an outer wire base 46, a molding layer 50 disposed on a top of a package substrate 10, and external connectors 55 disposed on a bottom surface of the package substrate 10.

The package substrate 10 may include a printed circuit board (PCB). The package substrate 10 may include a chip area 11 at a center of the package substrate 10, an inner peripheral area 12 surrounding the chip area 11, and an outer peripheral area 13 surrounding the inner peripheral area 12. The chip area 11 may have a square shape. The inner peripheral area 12 may have a frame shape surrounding four edges of the chip area 11. The outer peripheral area 13 may have a frame shape surrounding four edges of the inner peripheral area 12. In an embodiment the package substrate 10 may include a chip area 11 at a center of the package substrate 10 and a peripheral area 14 surrounding the chip area 11. In an embodiment, the peripheral area 14 may include an inner peripheral area 12 and an outer peripheral area 13 surrounding the inner peripheral area 12.

The plurality of the pads 21, 22, and 23 may include chip pads 21 disposed on the chip area 11, inner wire pads 22 disposed on the inner peripheral area 12, and outer wire pads 23 (e.g., first wire pads) disposed on the outer peripheral area 13. Referring to FIG. 1D, the inner wire pads 22 may have a circle shape and a symmetrical shape from a top view. The outer wire pads 23 may have a semi-circular shape, at least one flat side, or an asymmetric shape. The flat sides of the outer wire pads 23 may be co-planar with an outer side surface of the semiconductor package 100. The chip pads 21, the inner wire pads 22, and the outer wire pads 23 may include a metal such as copper (Cu), nickel (Ni), or silver (Ag). In an embodiment, from a top view, the inner wire pads may have a shape substantially as shown in FIG. 1D following the wording '22:'. In an embodiment, from a top view, the outer wire pads may have a shape substantially as shown as one of the examples in FIG. 1D following the wording "23:". In an embodiment, from a top view, the inner wire may have a shape substantially as shown in FIG. 1D following the wording '42:'. In an embodiment, from a top view, the outer wire may have a shape substantially as shown as one of the examples in FIG. 1D following the wording "43:".

The chip stack 30 may be mounted and disposed on the chip pads 21 on the chip area 11 of the package substrate 10. The chip stack 30 may include a plurality of semiconductor chips 31 and 32a-32d being stacked. The plurality of semiconductor chips 31 and 32a-32d may include a logic chip 31 disposed at the lowermost portion of the chip stack 30 and a plurality of memory chips 32a-32d stacked on the logic chip 31. The chip stack 30 may be electrically connected with the chip pads 21 through the substrate interconnectors 35. The logic chip 31 may be also electrically connected with the memory chips 32a-32d through the chip interconnectors 36. The substrate interconnectors 35 and the chip interconnectors 36 may include solder balls. In one embodiment, the substrate interconnectors 35 and the chip interconnectors 36 may include metal bumps such as copper (Cu).

The inner wires 42 may be disposed on the inner wire pads 22, and the outer wires 43 may be disposed on the outer wire pads. The inner wires 42 may be disposed on the inner wire pads 22 on the inner peripheral area 12. The inner wires 42 may be vertically formed as a pillar shape or a vertical line shape on the inner wire bases 45 on the inner wire pads 22. For example, the inner wires 42 may vertically uprightly erect on the inner wire base 45. The outer wires 43 may be disposed on the outer wire pads 23 on the outer peripheral area 13 on the package substrate 10. The outer wires 43 may vertically upwardly extend from the outer wire bases 46 on the outer wire pads 23 on the package substrate 10 in, for example, a zigzag shape. In an embodiment, the outer wires 43 may vertically upwardly extend from the outer wire bases 46 in a zigzag shape as illustrated in FIG. 1A.

Each of outer wires 43 may include a plurality of unit outer wires 43a (e.g., unit wires) arranged in a vertical direction. The unit outer wires 43a may have a bent shape. For example, each the unit outer wires 43a may have a shape in which one ends of two diagonal segments having a positive (+) slope (e.g., a right upward slope) and a negative (−) slope (e.g., a left upward slope) in contact with each other. That is, the unit outer wires 43a may have a bracket shape ('<' or '>'). The unit outer wires 43a might not be connected with each other and may be spaced apart from each other in a vertical direction. The inner and outer wires 42 and 43 may include gold (Au), silver (Ag), copper (Cu), aluminum (Al), or other metals. In an embodiment, a space between the two intersecting segments of a unit outer wire 43a adjacent to the point the segments intersect may form an acute angle. For example, a first segment having a negative (−) slope in contact with a second segment having a positive (+) slope of a unit outer wire 43a may form an acute angle adjacent to the point at which the two segments intersect. In an embodiment, a space between the two intersecting segments of a unit outer wire 43a adjacent to the point the segments intersect may form a right angle. For example, a first segment substantially horizontal with the package substrate 10 in contact with a second segment substantially perpendicular with the package substrate 10 of a unit outer wire 43a may form a substantially right angle adjacent to the point at which the two segments intersect. In an embodiment, the unit outer wires 43a are stacked over one another and might not be connected with each other. For example, a second unit outer wire may be stacked over a first unit outer wire. The second unit outer wire having a first segment with a negative (−) slope located over a second segment, having a positive (+) slope, of the first unit outer wire may be spaced apart from the first unit outer wire in a vertical direction. In an embodiment, the unit outer wires 43a are stacked over one another and may be connected with each other. For example, a second unit outer wire may be vertically stacked over a first unit outer wire. For example, the second unit outer wire having a first segment with a negative (−) slope located over a second segment, having a positive (+) slope, of the first unit outer wire may be in contact with the first unit outer wire. For example, one end of the first segment included in the second unit outer wire may be in contact with one end of the second segment of the first unit outer wire. In an embodiment, the one end of the first segment included in the second unit outer wire and the one end of the second segment of the first unit outer wire may intersect to form an acute angle adjacent to the point at which the two segments intersect. For example, adjacent unit outer wires (e.g., the first and second unit outer wires vertically stacked with one another) of the outer wire 43 may form an acute angle adjacent to the point where the two adjacent unit outer wires connect.

The molding layer 50 may include epoxy molding compound (EMC). The molding layer 50 may surround the pads 21, 22, and 23, the chip stack 30, and the inner and outer wires 42 and 43. In one embodiment, the molding layer 50 may surround the interconnectors 35 and 36. In one embodiment, the semiconductor package 100 may further include an underfill material surrounding the interconnectors 35 and 36. For example, the underfill material may fill spaces between the package substrate 10 and the logic chip 31 of the chip stack 30, between the logic chip 31 and the lowermost memory chip 32a, and between the memory chips 32a-32d. In this case, the molding layer 50 may surround side surfaces of the underfill material. Top surface of the molding layer 50, top ends of the inner wires 42, and top ends of the outer wires 43 may be co-planar. Top surface of the uppermost memory chip 32d of the chip stack 30 may be exposed without being covered by the molding layer 50. For example, the top surface of the uppermost memory chip 32d of the chip stack 30 and the top surface of the molding layer 50 may be co-planar. In one embodiment, the top surface of the uppermost memory chip 32d of the chip stack 30 may be covered with the molding layer 50.

The external connectors 55 may be disposed on the bottom surface of the package substrate 10. The external connectors 55 may include a solder ball. In one embodiment, the external connectors 55 may include a metal bump. The external connectors 55 may be omitted.

Referring to FIG. 1B, in a side view, side ends of the outer wires 43, for example, side ends of the unit outer wires 43a may be exposed on the side surface of the molding layer 50 of the semiconductor package 100. The side ends of the outer wires 43, for example, the side ends of the unit outer wires 43a, may be exposed in a dots form or points form aligned in the vertical direction. The top portions of the outer wires 43 may have a short segment shape extending in the vertical direction.

Referring to FIG. 1C, in a top view, the top ends of the inner wires 42 and the outer wires 43 may be exposed in a dots shape without being covered by the molding layer 50. The inner wires 42 may be disposed along four sides of the chip stack 30 to surround the chip stack 30. That is, the inner wires 42 may be disposed side-by-side to be in parallel with the four sides of the chip stack 30. The outer wires 43 may be disposed to surround the chip stack 30 and the inner wires 42 and to abut the outer surfaces of the semiconductor package 100. In one embodiment, the top ends of the outer wires 43 may be a semi-circular form or an arcuate form. In one embodiment, the top ends of the outer wires 43 may have a circle shape or a dots shape in the top view.

The inner wires 42 may effectively and efficiently dissipate heat generated from the chip stack 30 in an upward direction of the semiconductor package 100. The outer wires 43 may efficiently dissipate heat generated from the chip stack 30 in a lateral direction of the semiconductor package 100. In the chip stack 30, the logic chip 31 may generate higher heat than the memory chips 32a-32d. Lower portions of the inner wires 42 and lower portions of the outer wires 43 may be disposed on the package substrate 10 to be close to the logic chip 31. Accordingly, the inner wires 42 and the outer wires 43 can dissipate heat generated in the logic chip 31 more efficiently, in particular.

Figure 2A:
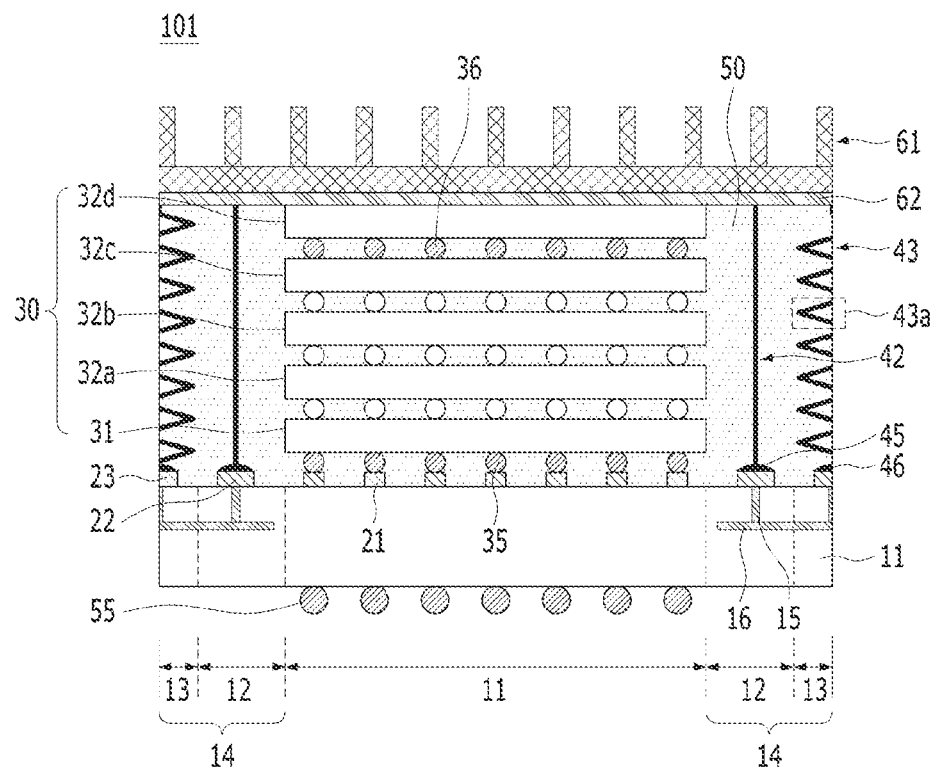
FIGS. 2A, 2B, and 2C illustrate semiconductor packages in accordance with embodiments of the present disclosure.
Figure 2B:
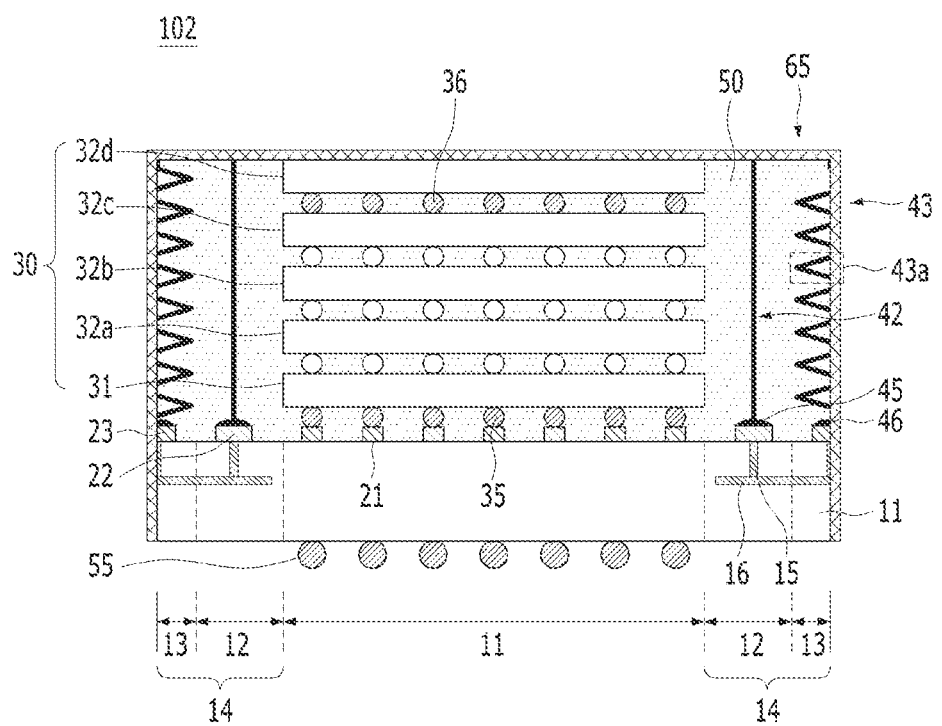
Figure 2C:
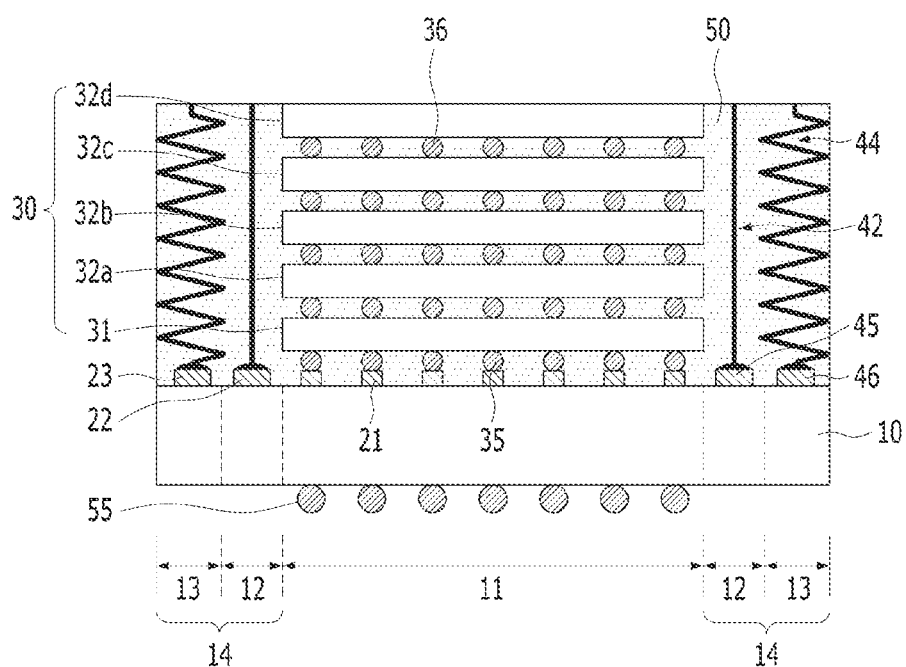

FIGS. 2A to 2C schematically illustrate semiconductor packages 101, 102, and 103 in accordance with additional embodiments of the present disclosure. Referring to FIG. 2A, in comparison with the semiconductor package 100 shown in FIGS. 1A to 1C, the semiconductor package 101 in accordance with an embodiment of the present disclosure may further include a heat sink 61 and a thermal interface material (TIM) layer 62. The heat sink 61 may be disposed on the top surface of the semiconductor package 100 shown in FIGS. 1A to 1C. The TIM layer 62 may be interposed between the molding layer 50 and the heat sink 61. The TIM layer 62 may be physically in contact with the top ends of the inner wires 42 and the top ends of the outer wires 43. In an embodiment, the TIM layer 62 may be disposed on a top surface of the molding layer.

The heat sink 61 may include a metal having excellent heat conductance and heat dissipation such as aluminum (Al). Heat transferred through the inner wires 42 and the outer wires 43 may be more effectively dissipated by the heat sink 61. In one embodiment, the TIM layer 62 may be omitted.

The package substrate 10 of the semiconductor package 101 may further include substrate vias 15 and substrate interconnections 16. The substrate vias 15 may selectively electrically connect the chip pads 21, the inner wire pads 22, and the outer wire pads 23 to the substrate interconnections 16. The substrate vias 15 may have a pillar shape to transmit electrical signals and heat in the vertical direction. The substrate interconnections 16 may extend in a horizontal direction. Side ends of the substrate interconnections 16 may be exposed on the side surfaces of the package substrate 10. Accordingly, heat of the inner wires 42 and the outer wires 43 may be dissipated to the side surfaces of the package substrate 10. In one embodiment, the substrate interconnections 16 may be electrically connected to ground interconnections or a ground plane. Accordingly, the substrate interconnections 16 may transmit a ground voltage. Accordingly, a grounding efficiency of the semiconductor package 101 can be improved. In one embodiment, side surfaces of the substrate vias 15 may also be exposed on the side surfaces of the package substrate 10. Other, undescribed reference numerals and elements can be understood with reference to FIGS. 1A-1C.

Referring to FIG. 2B, in comparison with the semiconductor package 100 shown in FIGS. 1A to 1C, the semiconductor package 102 in accordance with an embodiment of the present disclosure may include a shield layer 65 formed on the top surface and the side surfaces of the molding layer 50. The shield layer 65 may include metal. The shield layer 65 may cover the top surface and the side surfaces of the molding layer 50. The shield layer 65 may be in contact with the top ends of the inner wires 42 and the outer wires 43 on the top surface of the molding layer 50. The shield layer 65 may be in contact with the side ends of the outer wires 43 on the side surfaces of the molding layer 50. The semiconductor package 102 may further include the substrate vias 15 and the substrate interconnections 16 shown in FIG. 2A. The shield layer 65 may be in contact with the side surfaces of the substrate vias 15 or the substrate interconnections 16 on the side surfaces of the package substrate 10. Accordingly, the heat dissipation efficiency of the semiconductor package 102 may be further improved. The substrate vias 15 and the substrate interconnections 16 may be described with reference to FIG. 2A.

Referring to FIG. 2C, the semiconductor package 103 in accordance with an embodiment of the present disclosure may include outer wires 44 having a zigzag or a serpentine shape in a vertical upward direction on the top surface of the package substrate 10. In the semiconductor package 100 shown in FIGS. 1A to 1C, the outer wires 43 may have a plurality of separated brackets shape, but the semiconductor package 103 shown in FIG. 2C may have a plurality of connected brackets shape.

In one embodiment, the side ends of the outer wires 44 may be exposed on the side surface of the molding layer 50. In one embodiment, the side ends of the outer wires 44 may be buried in the molding layer 50. In one embodiment, the side ends of the outer wires 44 may be partially cut.

The semiconductor package 103 includes outer wires 44 disposed on both sides shown in FIGS. 1A to 1D, but the semiconductor package 103 may include the outer wires 44 disposed on only one side. For example, in one embodiment, the semiconductor package 103 may include the plurality of outer wires 44 arranged adjacent to at least one of the four sides of the chip stack 30.

In some embodiments of the present disclosure, the substrate vias 15, the substrate interconnections 16, the heat sink 61, the TIM layer 62, and the shield layer 65 may be selectively applied or omitted.

Figure 3A:
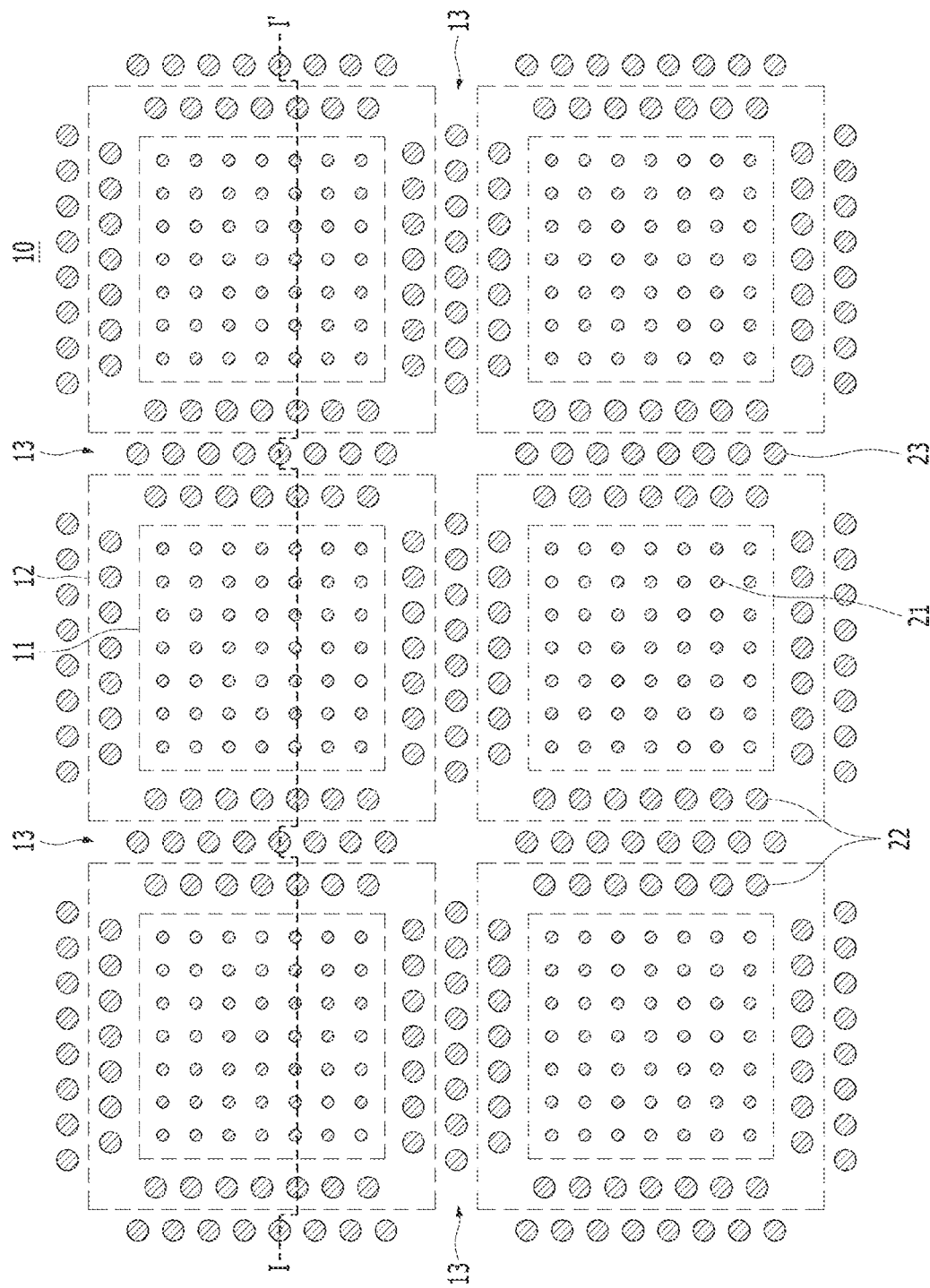
Figure 3B:
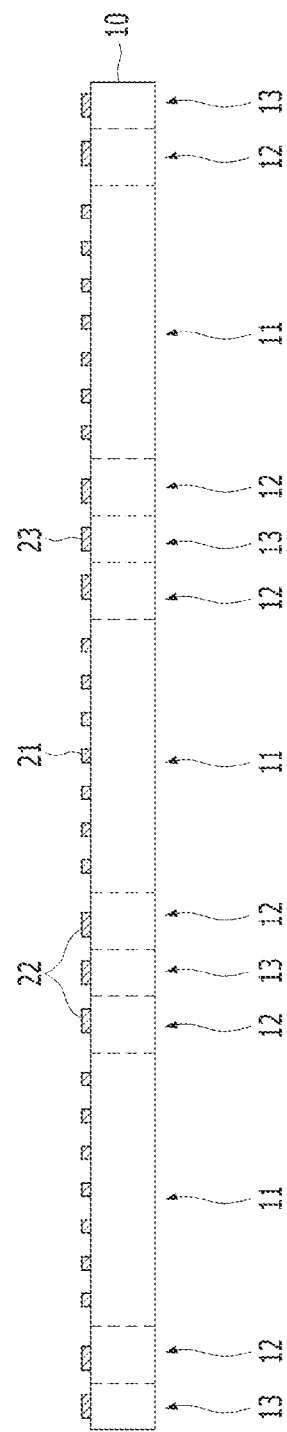

FIGS. 3A and 3B to 14A and 14B illustrate a method of manufacturing a semiconductor package in accordance with an example of an embodiment of the present disclosure. FIG. 3B is a longitudinal cross-sectional view taken along the line I-I' in FIG. 3A. Referring to 3A and 3B, a method of manufacturing a semiconductor package in accordance with an embodiment of the present disclosure may include firstly, preparing a package substrate 10 on which a plurality of pads 21, 22, and 23 are formed and disposed. The package substrate 10 may include a printed circuit board (PCB). The package substrate 10 may include a plurality of chip areas 11, inner peripheral areas 12, and outer peripheral areas 13. The chip areas 11 may be arranged in a matrix form having a plurality of rows and a plurality of columns. Each of the inner peripheral areas 12 may have a small frame shape surrounding the chip areas 11. Each of the outer peripheral areas 13 may have a large frame shape surrounding the inner peripheral areas 12. In one embodiment, the outer peripheral areas 13 may have a gird shape separating the inner peripheral areas 12. Virtual boundary lines of the chip areas 11, the inner peripheral areas 12, and the outer peripheral areas 13 are indicated using dotted lines. In one embodiment, the outer peripheral areas 13 may be scribe lanes extending between the inner peripheral areas 12 to separate the chip areas 11.

The plurality of pads 21, 22, and 23 may include chip pads 21, inner wire pads 22, and outer wire pads 23. The chip pads 21 may be arranged in rectangle areas in a matrix form formed by parallel virtual vertical lines and parallel virtual horizontal lines. Referring to FIG. 3A, the inner wire pads 22 may be disposed side-by-side on virtual straight lines in the row direction and the column direction in the inner peripheral areas 12. The inner wire pads 22 may be disposed adjacent to upper sides, lower sides, left sides, and right sides of the chip areas 11. For example, the inner wire pads 22 may be arranged side-by-side in the inner peripheral areas 12 having the small frame shape surrounding the chip areas 11. The outer wire pads 23 may be disposed side-by-side on virtual straight lines extending in the row direction and the column direction in the outer peripheral areas 13. For example, the outer wire pads 23 may be arranged side-by-side to divide or surround the inner peripheral areas 12 in the scribe lane.

The inner wire pads 22 and the outer wire pads 23 adjacent to each other in the row direction may be staggered so as not to overlap each other in the row direction. In addition, the inner wire pads 22 and the outer wire pads 23 adjacent to each other in the column direction may be staggered so as not to overlap each other in the column direction. For example, the inner wire pads 22 and the outer wire pads 23 may be arranged in a zigzag form, a staggered form, or an alternating form in the same direction.

The plurality of pads 21, 22, and 23 may include metal. For example, the plurality of pads 21, 22, and 23 may include copper (Cu), nickel (Ni), silver (Ag), titanium (Ti), aluminum (Al), gold, various other metals, a metal compound, or a metal alloy.

Figure 4A:
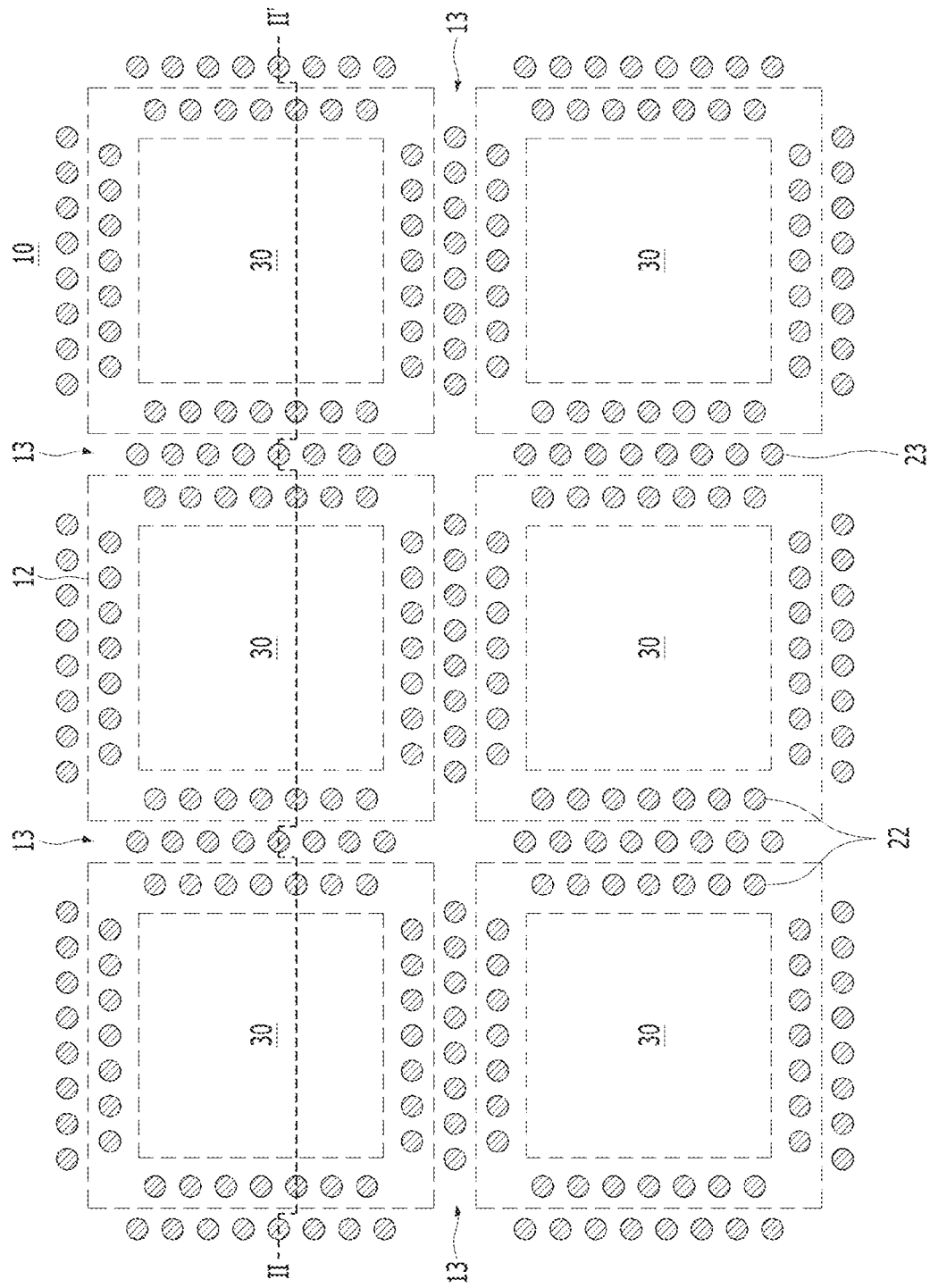

FIG. 4B is a longitudinal sectional view taken along the line II-II' in FIG. 4A. Referring to FIGS. 4A and 4B, the method may further include stacking chip stacks 30 on the chip area 11 of the package substrate 10. The inner peripheral areas 12 may surround four sides of the chip stacks 30. The chip stack 30 may include a logic chip 31 and memory chips 32a-32d. The logic chip 31 may be located at the lowermost (bottom) portion of the chip stack 30. The memory chips 32a-32d may be stacked on the logic chip 31. The logic chip 31 and the chip pads 21 of the chip stack 30 may be electrically connected to each other through substrate interconnectors 35. The plurality of memory chips 32a-32d may be electrically connected to each other through the chip interconnectors 36. The interconnectors 35 and 36 may be solder balls. In one embodiment, the interconnectors 35 and 36 may be metal bumps. In one embodiment, an underfill material may be provided between the package substrate 10 and the logic chip 31, between the logic chip 31 and the lowermost memory chip 32a, and between the memory chips 32a-32d, respectively. In the drawing, the chip stack 30 has the four memory chips 32a-32d, but it is not limited thereto. The chip stack 30 may include a larger number of memory chips than illustrated.

Figure 5A:
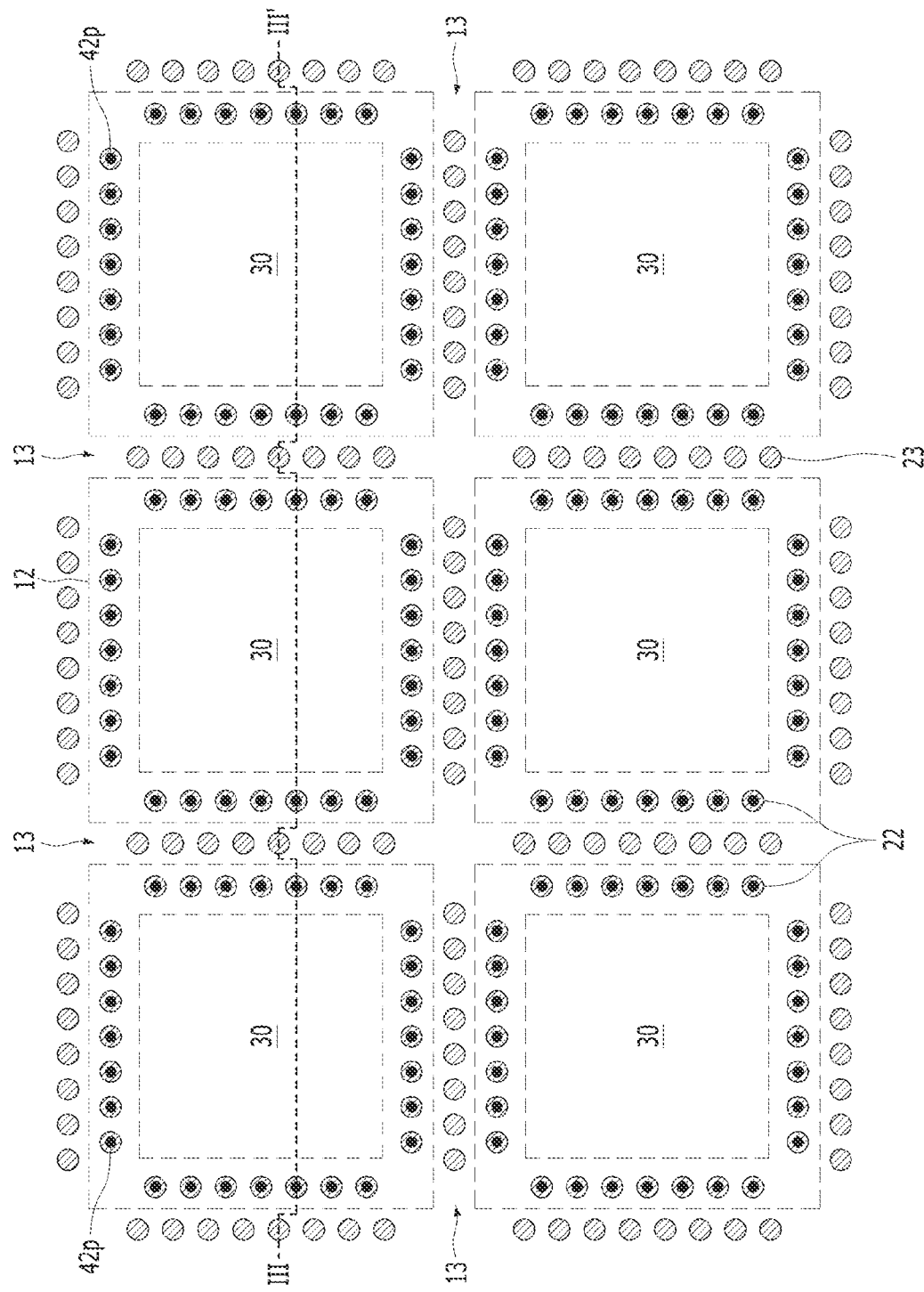
Figure 5B:
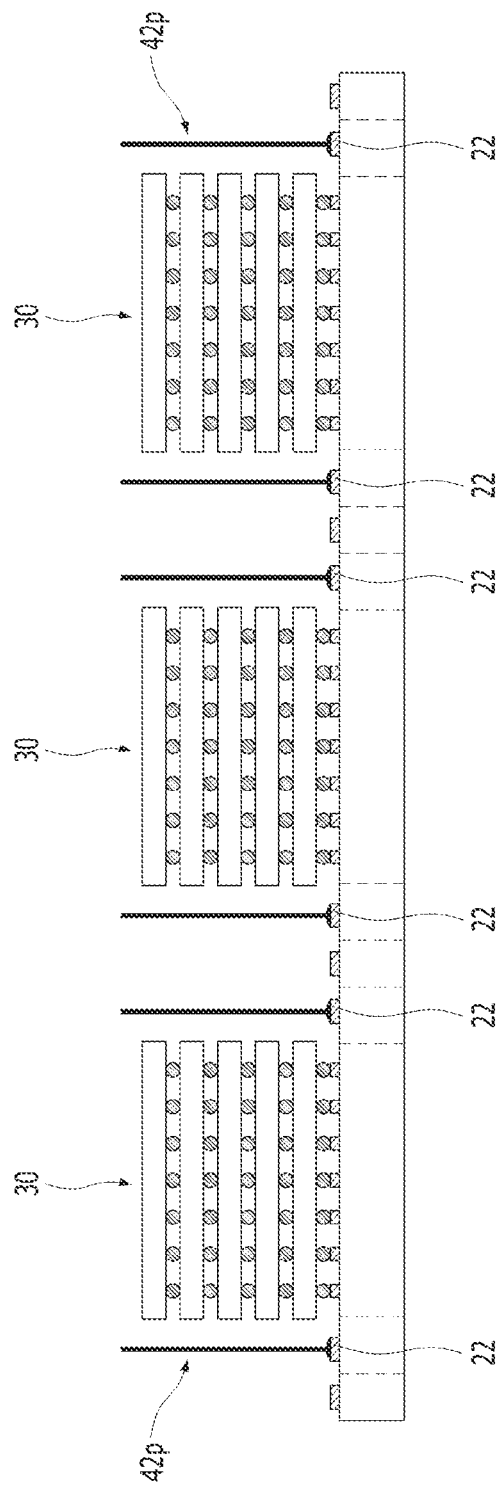

FIG. 5B is a longitudinal sectional view taken along the line III-III' of FIG. 5A. Referring to FIGS. 5A and 5B, the method may further include performing a first wiring process to form preliminary inner wires 42p on the inner wire pads 22. The top ends of the preliminary inner wires 42p may be positioned at a higher level than the top surface of the chip stack 30.

Figure 6A:
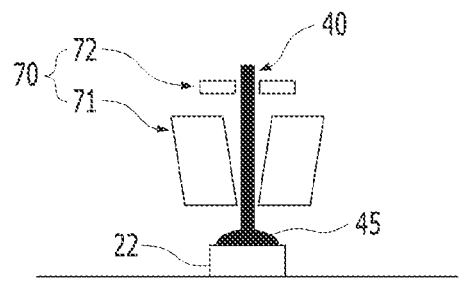
Figure 6B:
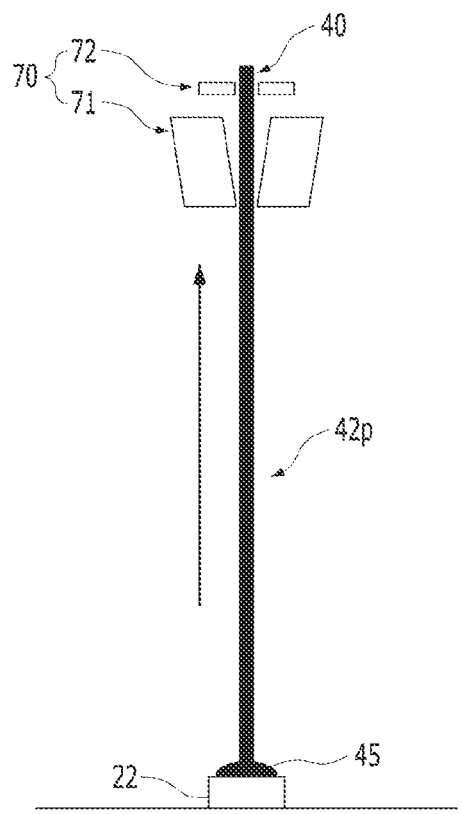
Figure 6C:
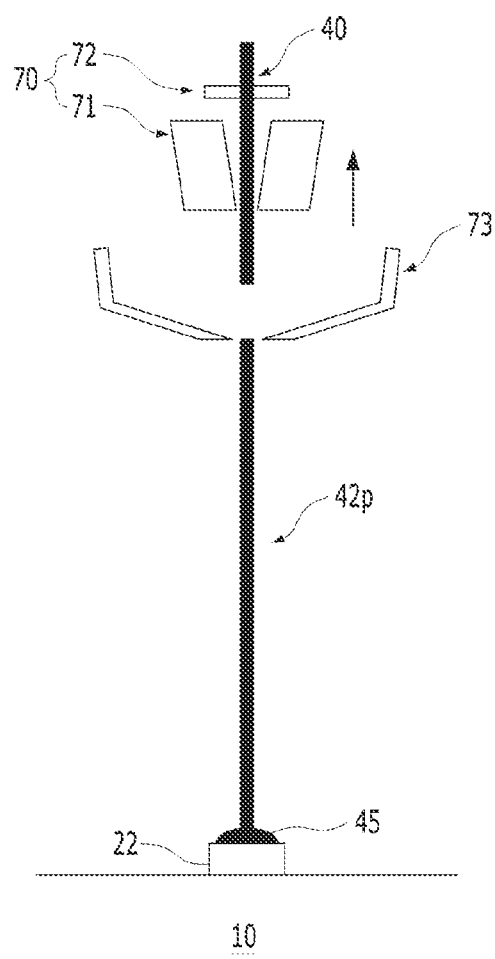

FIGS. 6A to 6C illustrate a first wiring process. Referring to FIG. 6A, the first wiring process may include forming an inner wire base 45 on the inner wire pad 22 using a bonding machine 70. The inner wire base 45 may enhance adhesion between the inner wire pad 22 and the wire material 40 so that the wire can be formed. The wire material 40 may be provided through a gap of the bonding tip 71 of the bonding machine 70. A clamp 72 of the bonding machine 70 may be in a state in which the wire material 40 is not clamped.

Referring to FIG. 6B, the first wiring process may include raising the bonding machine 70 from the inner wire base 45 in a vertical direction to form a preliminary inner wire 42p.

Referring to FIG. 6C, the first wiring process may include clamping the wire material 40 using the clamper 72 and cutting the upper portion of the preliminary inner wire 42p using the cutter 73. The bonding machine 70 may rise with the clamper 72 clamping the wire material 40. The preliminary inner wire 42p may have a vertical line shape.

Figure 7A:
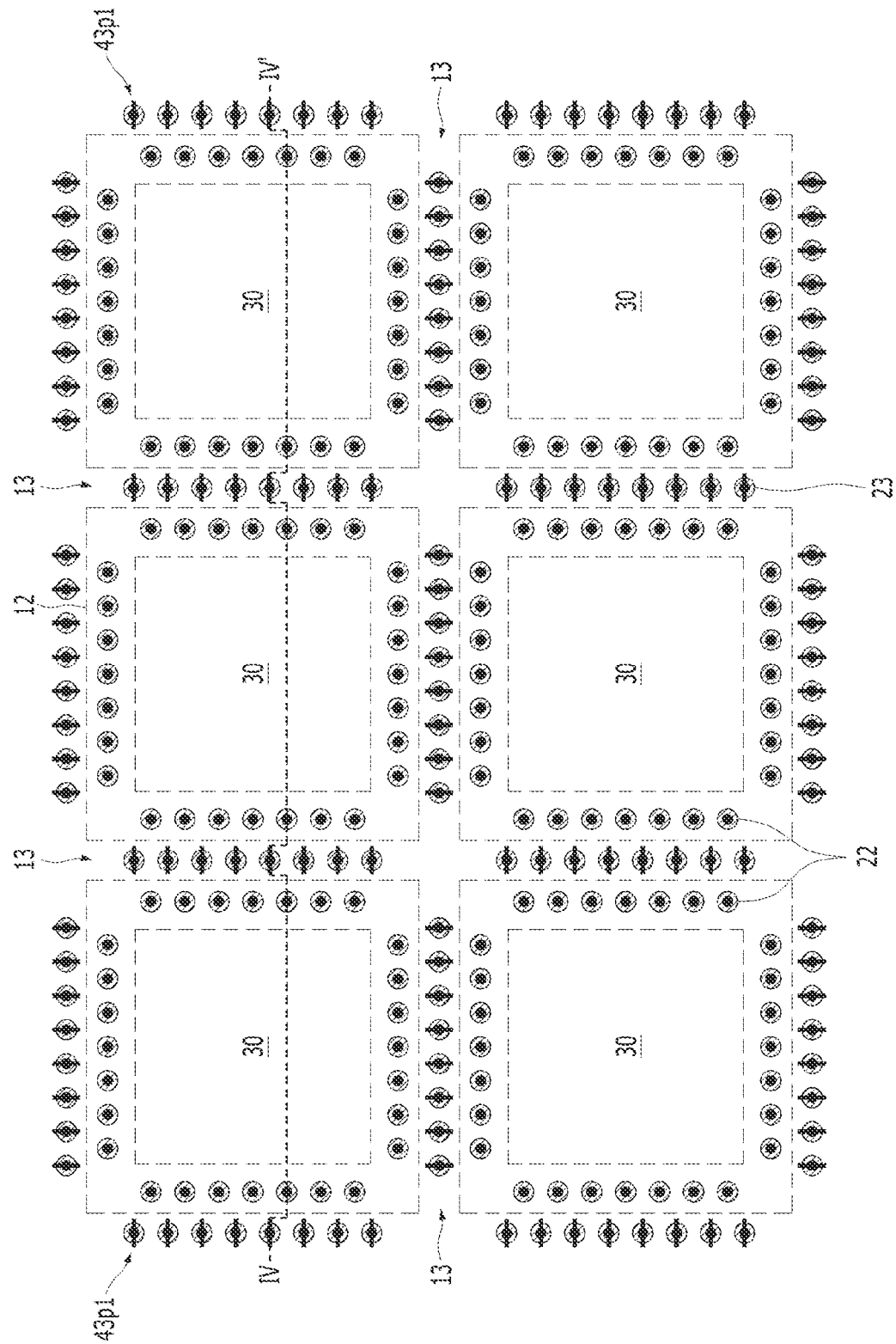
Figure 7B:
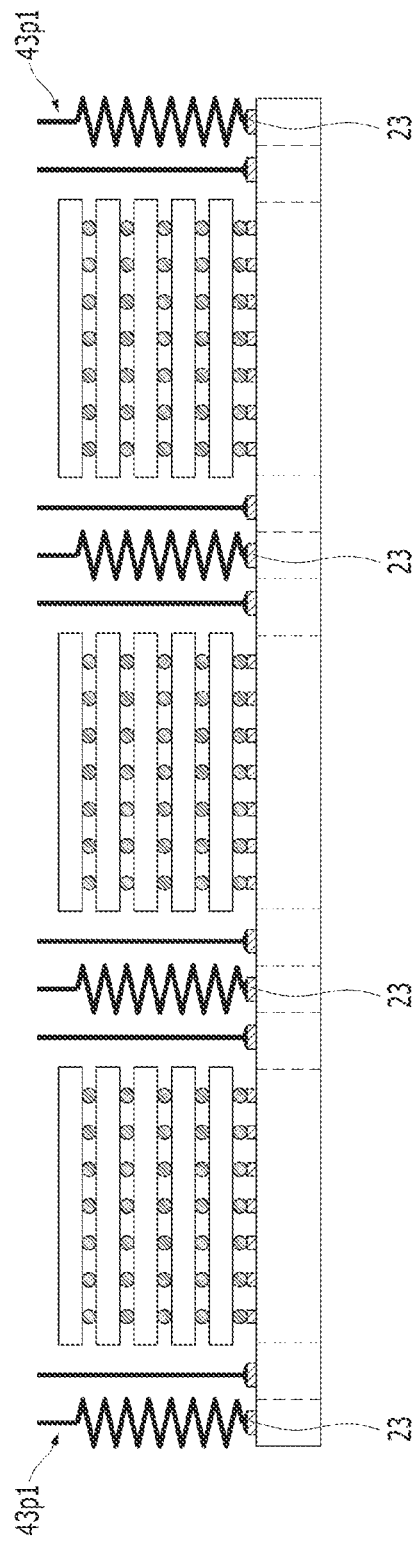

FIG. 7B is a longitudinal cross-sectional view taken along line IV-IV' of FIG. 7A. Referring to FIGS. 7A and 7B, the method may further include performing a second wiring process to form first preliminary outer wires 43p1 on the outer wire pads 23.

Figure 8A:
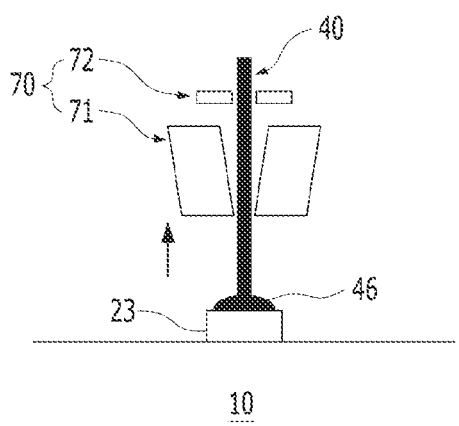

FIGS. 8A to 8K illustrate a second wiring process. Referring to FIG. 8A, the second wiring process may include forming a outer wire base 46 on the outer wire pad 23 using the bonding machine 70, and forming a first vertical preliminary wire 40a on the outer wire base 46. The bonding machine 70 may rise vertically to provide wire material 40 to form the first vertical preliminary wire 40a. The first vertical preliminary wire 40a may have a segment shape vertically formed on the outer wire base 46.

Figure 8B:
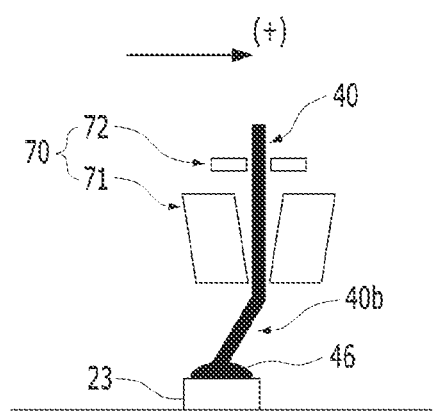

Referring to FIG. 8B, the second wiring process may include moving the bonding machine 70 in a positive (+) horizontal direction. The first vertical preliminary wire 40a may be transformed into a first light-bent preliminary wire 40b lightly inclined in a positive (+) diagonal direction.

Figure 8C:
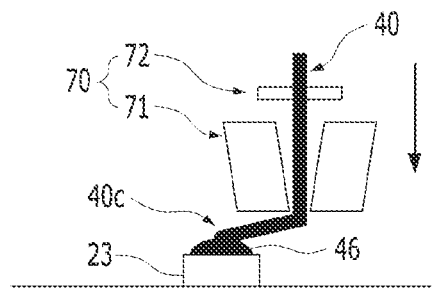

Referring to FIG. 8C, the second wiring process may include clamping the wire material 40 using the clamper 72 and lowering the bonding machine 70. The first light-bent preliminary outer wire 40b may be transformed into a first deep-bent preliminary outer wire 40c deeply inclined in the positive (+) diagonal direction. The first light-bent preliminary outer wire 40b may have a relatively slightly inclined shape than the first deep-bent preliminary outer wire 40c. That is, the first deep-bent preliminary outer wire 40c may have a relatively sufficiently inclined shape than the first light-bent preliminary outer wire 40b. For example, the first light-bent preliminary outer wire 40b may have a shape closer to a vertical line than the first deep-bent preliminary outer wire 40c, and the first deep-bent preliminary outer wire 40c may have a shape closer to a horizontal line than the first light-bent preliminary outer wire 40b.

Figure 8D:
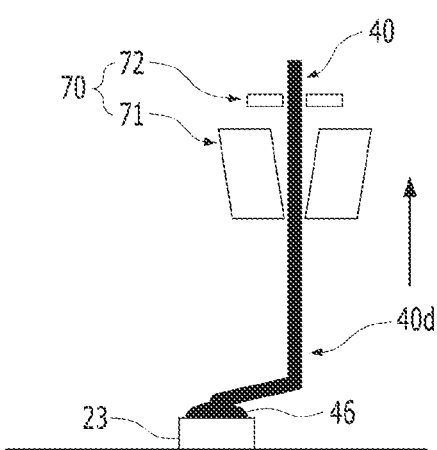

Referring to FIG. 8D, the second wiring process may further include opening the clamper 72 and raising the bonding machine 70 to form a second vertical preliminary outer wire 40d on the end portion of the first deep-bent preliminary outer wire 40c.

Figure 8E:
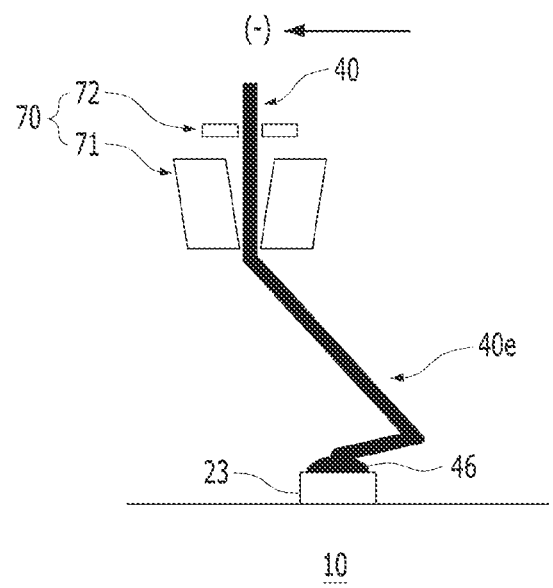

Referring to FIG. 8E, the second wiring process may further include moving the bonding machine 70 in a negative (−) horizontal direction (e.g., a leftward direction). The second vertical preliminary outer wire 40d is transformed and formed into a second light-bent preliminary outer wire 40e lightly inclined in a negative (−) diagonal direction (e.g., a left upward direction).

Figure 8F:
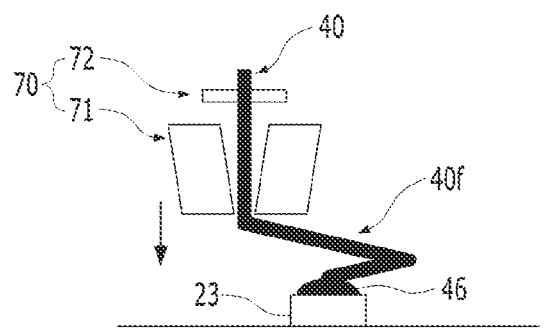

Referring to FIG. 8F, the second wiring process may include clamping the wire material 40 using the clamper 72 and lowering the bonding machine 70. The second light-bent preliminary outer wire 40e may be transformed into a second deep-bent preliminary outer wire 40f deeply inclined in the negative (−) diagonal direction. The second light-bent preliminary outer wire 40e may have a relatively slightly inclined shape than the second deep-bent preliminary outer wire 40f. That is, the second deep-bent preliminary outer wire 40f may have a relatively sufficiently inclined shape than the second light-bent preliminary outer wire 40e. For example, the second light-bent preliminary outer wire 40e may have a shape closer to the vertical line than the second deep-bent preliminary outer wire 40f, and the second deep-bent preliminary outer wire 40f may have a shape closer to the horizontal line than the second light-bent preliminary outer wire 40e.

Figure 8G:
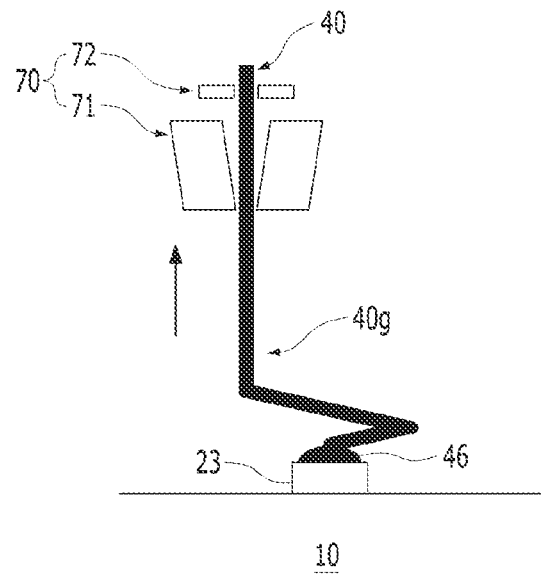

Referring to FIG. 8G, the second wiring process may further include opening the clamper 72 and raising the bonding machine 70 for providing the wire material 40 to further form a third vertical preliminary outer wire 40g on the end of the second deep-bent preliminary outer wire 40f.

Figure 8H:
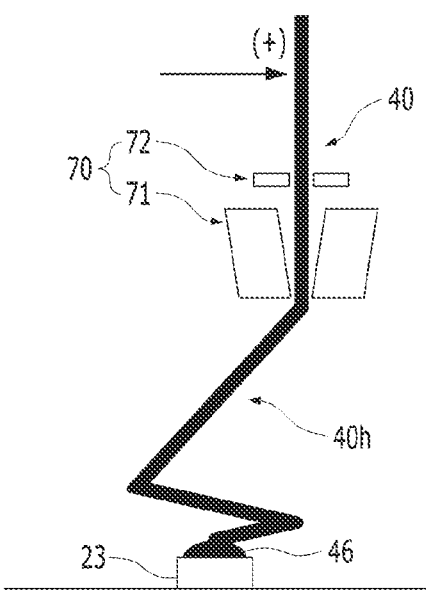

Referring to FIG. 8H, the second wiring process may include moving the bonding machine 70 in the positive (+) horizontal direction (e.g., a rightward direction). Similar to the shapes described above, the third vertical preliminary outer wire 40g may be transformed and formed into a third light-bent preliminary outer wire 40h lightly inclined in the positive (+) diagonal direction (e.g., a right upward direction).

Figure 8I:
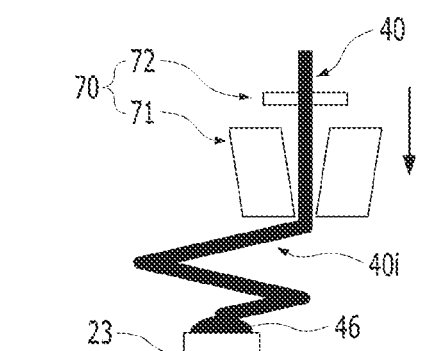

Referring to FIG. 8I, the second wiring process may include clamping the wire material 40 using the clamper 72 and lowering the bonding machine 70. The third light-bent preliminary outer wire 40h may be transformed into a third deep-bent preliminary outer wire 40i deeply inclined in the positive (+) diagonal direction. The third light-bent preliminary outer wire 40h may have a relatively slightly inclined shape than the third deep-bent preliminary outer wire 40i. That is, the third deep-bent preliminary outer wire 40i may have a relatively sufficiently inclined shape than the third light-bent preliminary outer wire 40h. For example, the third light-bent preliminary outer wire 40h may have a shape closer to a vertical line shape than the third deep-bent preliminary outer wire 40i, and the third deep-bent preliminary outer wire 40i may have a shape closer to a horizontal line shape than the third light-bent preliminary outer wire 40h.

Referring to FIG. 8J, the second wiring process may include repeating the unit processes described with reference to FIGS. 8D to 8I to form a first preliminary outer wire 43p1. The second wiring process may further include forming a final vertical preliminary outer wire 40x in a final step.

Figure 8K:
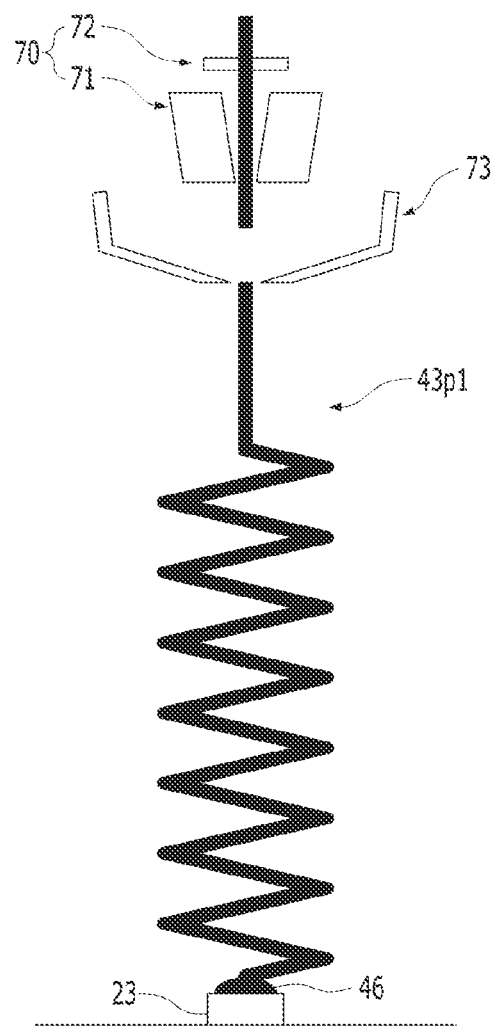

Referring to FIG. 8K, the second wiring process may include clamping the wire material 40 using the clamper 72 and cutting an upper portion of the first preliminary outer wire 43p1 using a cutter 73. The bonding machine 70 may rise with the clamper 72 clamping the wire material 40. The first preliminary outer wire 43p1 may be formed in a zigzag shape in the vertical direction.

The first preliminary outer wires 43p1 may have a segment shape bisecting the outer wire pads 23. The first preliminary outer wires 43p1 may be shortly extended to be perpendicular to the outer peripheral areas 13. The first preliminary outer wires 43p1 may have a shape of a plurality of segments shortly extending in the positive (+) and negative (−) diagonal directions with respect to the surface of the package substrate 10. For example, the first preliminary outer wires 43p1 may be formed in the zigzag shape upward from the top surface of the outer wire pads 23. Top ends of the first preliminary outer wires 43p1 may also be located at a level higher than the top surface of the chip stack 30.

Referring to FIG. 9, the method may further include performing a molding process. The molding process may include dipping the workpiece of FIGS. 7A and 7B in a liquid or gel state molding compound 50a in a reservoir R in a face-down method. The face-down method is performing the process turning the top of the workpiece face down. According to the face-down method, physical stress applied by the molding compound 50a to the wires 42p and 43p1 by gravity can be weakened and neglected. Accordingly, physical deformation of the wires 42p and 43p1 in the molding process can be prevented.

Figure 10:
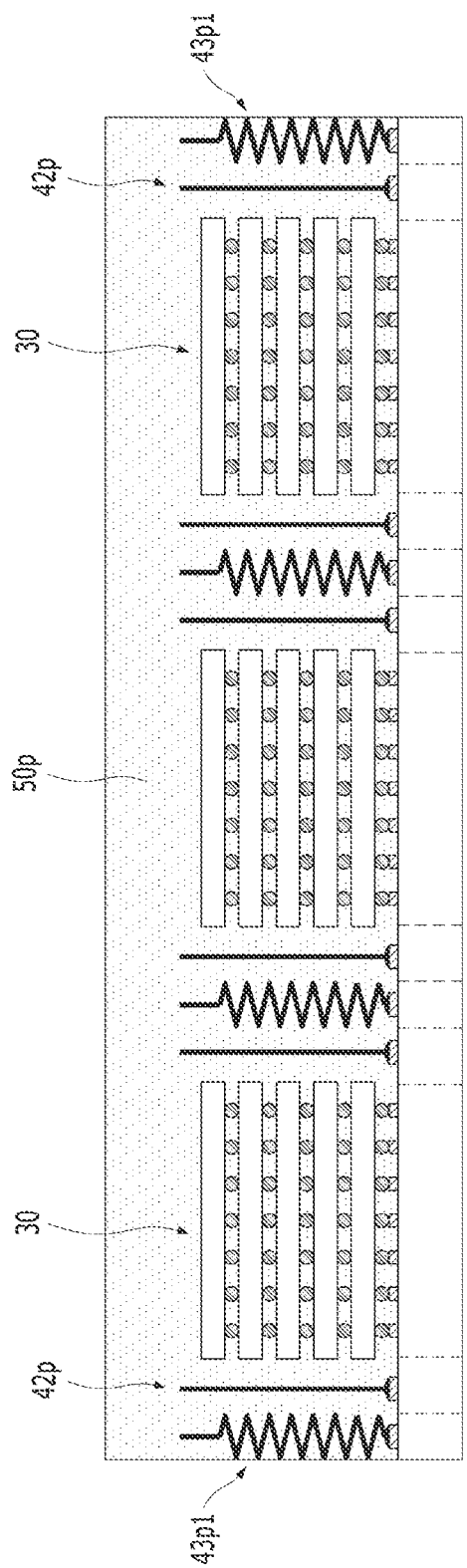

Referring to FIG. 10, the method may further include performing a curing process to cure the molding compound 50a. The curing process may include a heating process and a drying process. The molding compound 50a can be cured into a preliminary molding layer 50p. The preliminary molding layer 50p may surround the chip stacks 30, the preliminary inner wires 42p, and the first preliminary outer wires 43p1. The preliminary molding layer 50p may cover the top surfaces of the chip stacks 30, the top ends of the preliminary inner wires 42p, and the top ends of the first preliminary outer wires 43p1.

Figure 11:
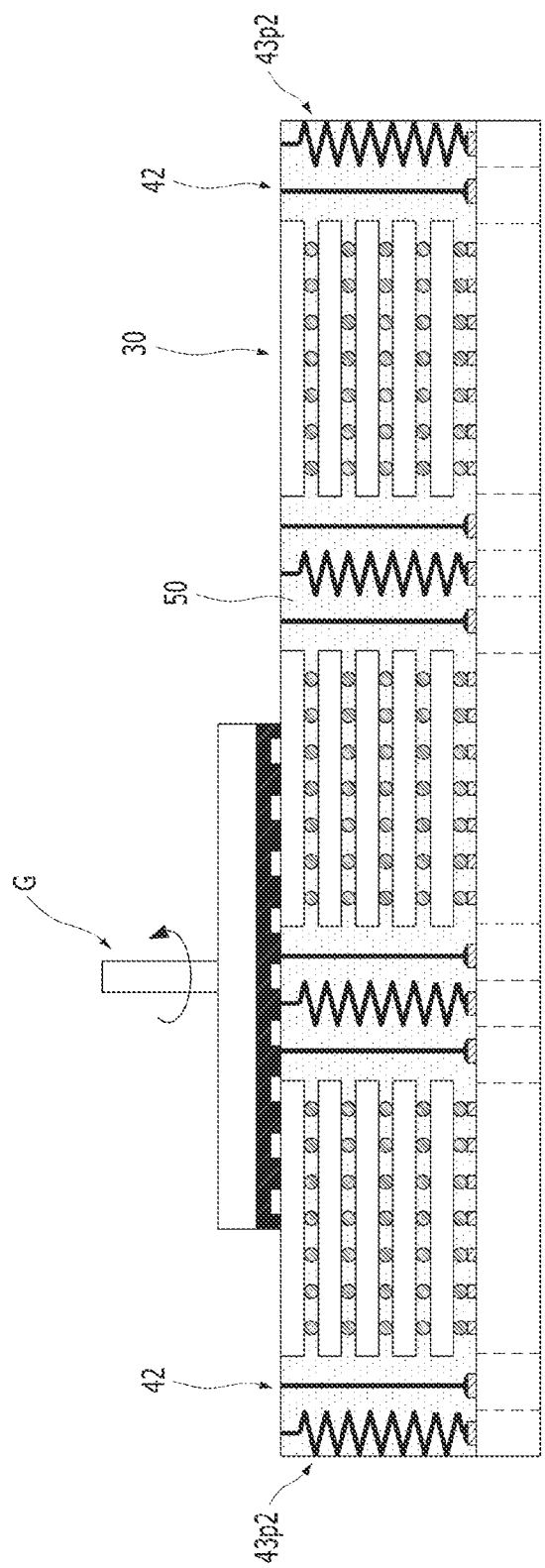

Referring to FIG. 11, the method may include partially performing a grinding process using a grinder G to remove upper portions of the preliminary molding layer 50p, the top ends of the preliminary inner wires 42p, the top ends of the first preliminary outer wires 43p1. The preliminary molding layer 50p from which the upper portion is partially removed may be formed as a molding layer 50. The preliminary inner wires 42p from which the top ends are partially removed may be formed as inner wires 42. The first preliminary outer wires 43p1 from which top ends are partially removed may be formed as second outer wires 43p2. The top surface of the molding layer 50, the top ends of the inner wires 42, and the top ends of the second outer wires 43p2 may be coplanar. The top surfaces of the chip stacks may be exposed. Accordingly, the top surface of the molding layer 50, the top ends of the inner wires 42, the top ends of the second outer wires 43p2, and the top surfaces of the chip stacks 30 may be coplanar. In one embodiment, the top surfaces of the chip stacks 30 may be covered with a molding layer 50.

Figure 12:
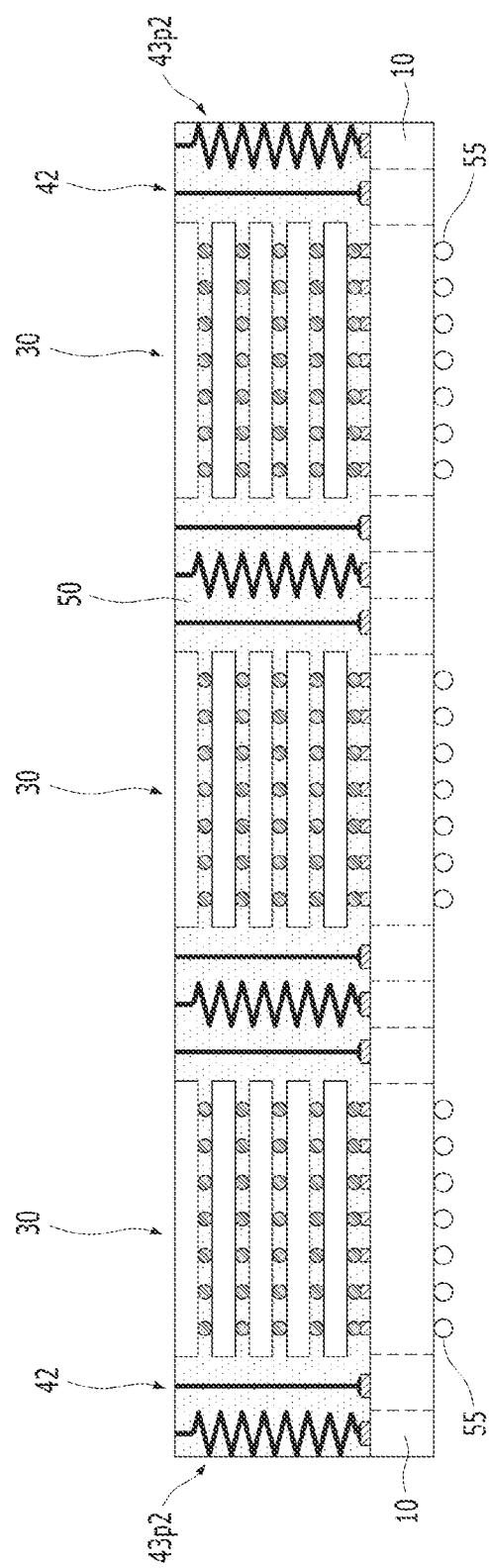

Referring to FIG. 12, the method may include forming external connectors 55 on a bottom surface of the package substrate 10 of the workpiece. The external connectors 55 may include solder balls. In one embodiment, the external connectors 55 may include metal bumps.

Referring to FIGS. 13A and 13B, the method may further include performing a sawing process to separate the workpiece of FIG. 12 into a plurality of individual semiconductor packages. The sawing process may include cutting the package substrate 10, the outer wire pads 23, the second outer wires 43p2, and the molding layer 50 along the outer peripheral areas 13 of the package substrate 10 using a sawing machine S. The second outer wires 43p2 may be formed as outer wires 43 through the sawing process. With further reference to FIGS. 2A and 2B, the substrate vias 15 and the substrate interconnections 16 may also be cut to be exposed on the side surface of the package substrate 10. Side ends of the outer wires 43 may be exposed on the side surfaces of the molding layer 50. Subsequently, the semiconductor package 100 shown in FIGS. 1A to 1C may be manufactured by performing the processes described with reference to FIGS. 3A and 3B to 11 and 12A.

Figure 14A:
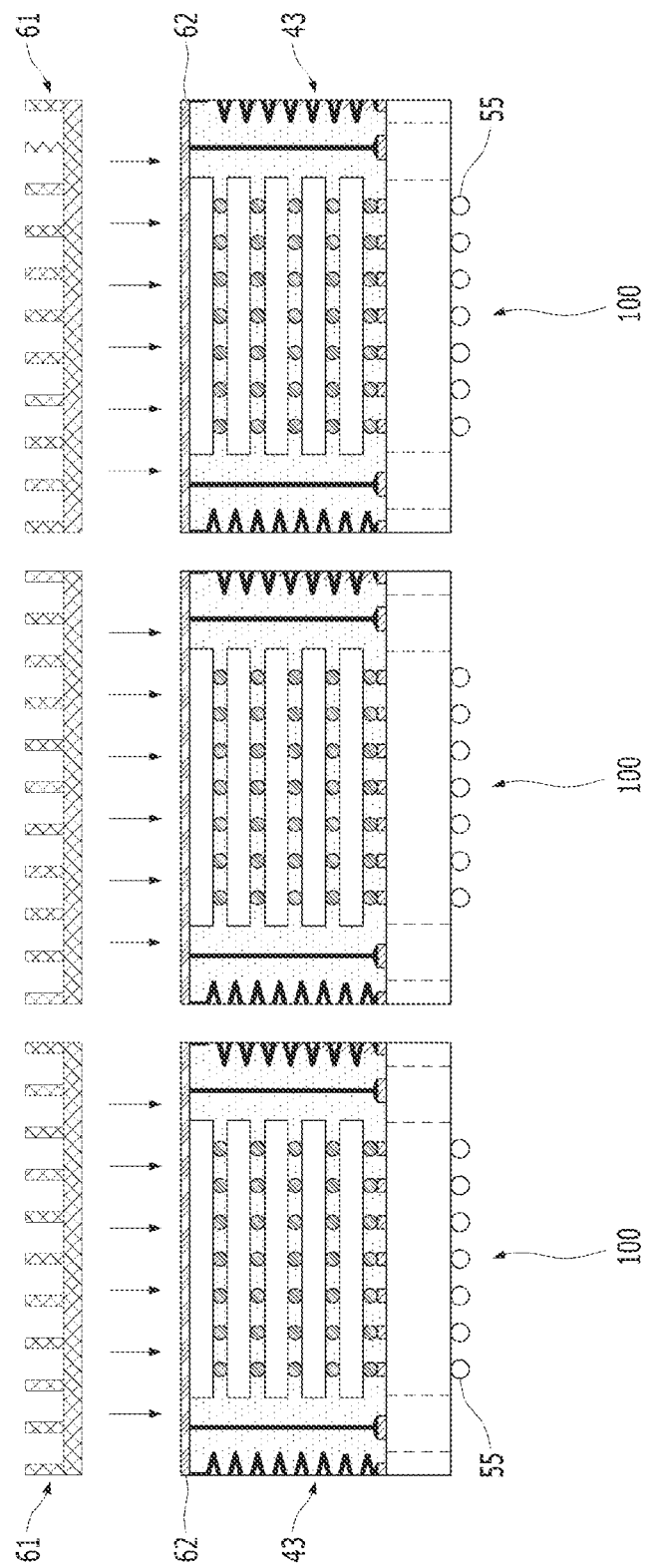

Referring to FIG. 14A, the method may further include attaching heat sinks 61 on top surfaces of the separated semiconductor packages 100. The method may further include forming a thermal interface material (TIM) layer 62 between the top surfaces of the semiconductor packages 100 and the heat sinks 61. For example, the method may further include providing the thermal interface material (TIM) layer 62 on the top surfaces of the semiconductor packages 100 and providing the heat sinks 61 on the TIM layer 62. By performing the process, the semiconductor package 101 shown in FIG. 2A may be manufactured.

Figure 14B:
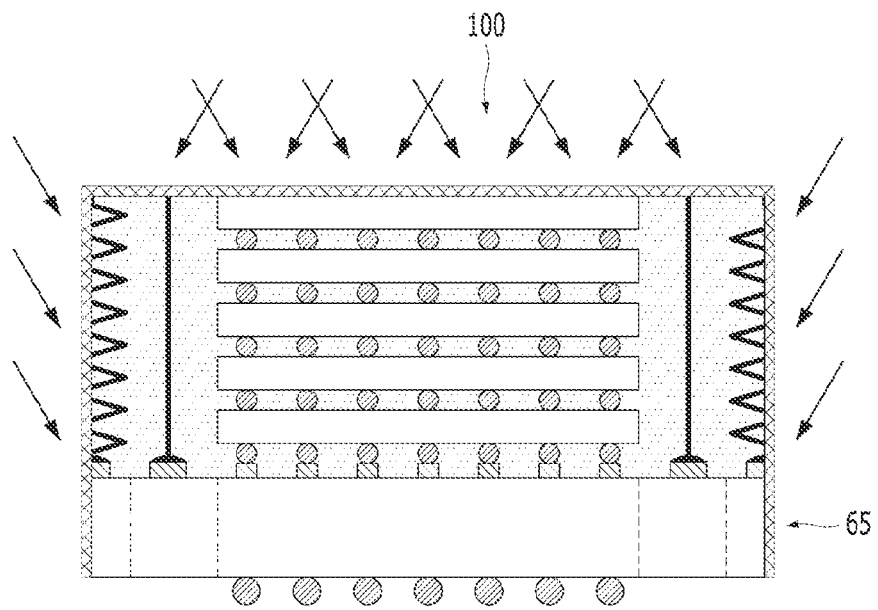

Alternatively, referring to FIG. 14B, the method may further include forming a shield layer 65 on top and side surfaces of the separated semiconductor package 100. The forming the shield layer 65 may further include forming a metal film on the top and side surfaces of the semiconductor package 100 by performing a sputtering process. The sputtering process may be performed while tilting and rotating the semiconductor package 100. The shield layer 65 may include metal. By performing the processes, the semiconductor package 102 shown in FIG. 2B may be manufactured.

Figure 15:
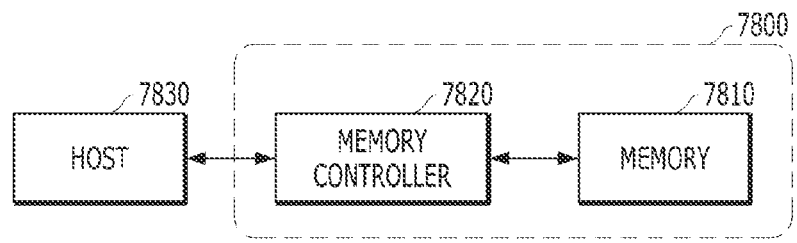
FIG. 15 shows a block diagram illustrating an electronic system including a memory card employing at least one of the semiconductor packages according to described embodiments.

FIG. 15 shows a block diagram illustrating an electronic system including a memory card 7800 employing at least one of the semiconductor packages 100 to 103 according to described embodiments. The memory card 7800 includes a memory 7810, such as a nonvolatile memory device, and a memory controller 7820. The memory 7810 and the memory controller 7820 may store data or read out the stored data. At least one of the memory 7810 and the memory controller 7820 may include at least one of the semiconductor packages 100 to 103 according to described embodiments.

The memory 7810 may include a nonvolatile memory device to which the technology of an embodiment of the present disclosure is applied. The memory controller 7820 may control the memory 7810 such that stored data is read out or data is stored in response to a read/write request from a host 7830.

Figure 16:
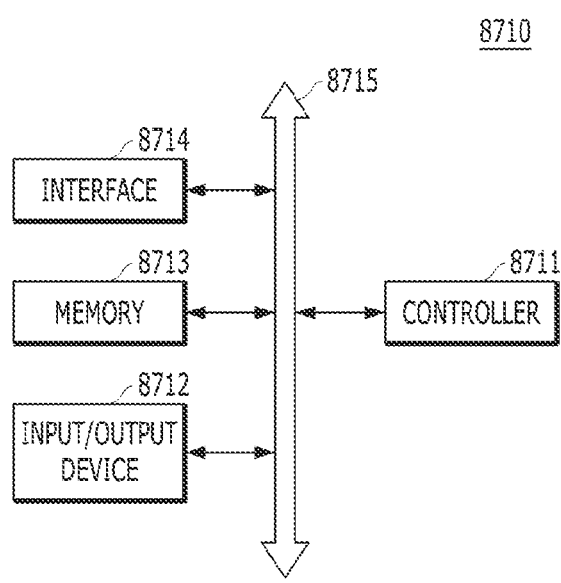
FIG. 16 shows a block diagram illustrating an electronic system including at least one of the semiconductor packages according to described embodiments.

FIG. 16 shows a block diagram illustrating an electronic system 8710 including at least one of the semiconductor packages 100 to 103 according to described embodiments. The electronic system 8710 may include a controller 8711, an input/output device 8712, and a memory 8713. The controller 8711, the input/output device 8712, and the memory 8713 may be coupled with one another through a bus 8715 providing a path through which data move.

In an embodiment, the controller 8711 may include one or more microprocessor, digital signal processor, microcontroller, and/or logic device capable of performing the same functions as these components. The controller 8711 or the memory 8713 may include one or more of the semiconductor packages 100 to 103 according to the embodiments of the present disclosure. The input/output device 8712 may include at least one selected among a keypad, a keyboard, a display device, a touchscreen, and so forth. The memory 8713 is a device for storing data. The memory 8713 may store data and/or commands to be executed by the controller 8711, and the like.

The memory 8713 may include a volatile memory device, such as a DRAM device, and/or a nonvolatile memory device, such as a flash memory device. For example, flash memory may be mounted to an information processing system such as a mobile terminal or a desktop computer. The flash memory may constitute a solid-state drive (SSD). In this case, the electronic system 8710 may stably store a large amount of data in a flash memory system.

The electronic system 8710 may further include an interface 8714 configured to transmit and receive data to and from a communication network. The interface 8714 may be a wired or wireless type. For example, the interface 8714 may include an antenna or a wired or wireless transceiver.

The electronic system 8710 may be realized as a mobile system, a personal computer, an industrial computer, or a logic system performing various functions. For example, the mobile system may be any one of a personal digital assistant (PDA), a portable computer, a tablet computer, a mobile phone, a smart phone, a wireless phone, a laptop computer, a memory card, a digital music system, and an information transmission/reception system.

If the electronic system 8710 represents equipment capable of performing wireless communication, the electronic system 8710 may be used in a communication system using a technique of CDMA (code division multiple access), GSM (global system for mobile communications), NADC (north American digital cellular), E-TDMA (enhanced-time division multiple access), WCDMA (wideband code division multiple access), CDMA2000, LTE (long term evolution), or Wibro (wireless broadband Internet).

According to the embodiments of the present disclosure, since heat generated in the semiconductor package can be effectively dissipated to upper and lateral directions, performance and lifetime of the semiconductor chips in the semiconductor package can be improved.

While this disclosure contains many specifics, these should not be construed as limitations on the scope of the present teachings or of what may be claimed, but rather as descriptions of features that may be specific to particular embodiments of the present teachings. Certain features that are described in this patent document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. Moreover, the separation of various system components in the embodiments described in this patent document should not be understood as requiring such separation in all embodiments. Only a few embodiments and examples are described. Other embodiments, enhancements, and variations can be made based on what is described and illustrated in this patent document.

What is claimed is:

1. A semiconductor package comprising:
a chip stack mounted on a package substrate;
an outer wire disposed on the package substrate, wherein the outer wire includes a first unit outer wire; and
a molding layer surrounding the chip stack and the outer wire,
wherein the first unit outer wire includes a first segment and a second segment, wherein the first segment is in contact with the second segment to form an acute angle adjacent to a point at which the first and second segments intersect,
wherein the outer wire includes a second unit outer wire stacked over the first unit outer wire,
wherein the second unit outer wire includes a third segment and a fourth segment,
wherein the third segment intersects with the fourth segment to form an acute angle adjacent to a point at which the first and second segments intersect, and
wherein the second segment of the first unit outer wire intersects with the third segment of the second unit outer wire to form an acute angle adjacent to a point at which the second segment of the first unit outer wire intersects with the third segment of the second unit outer wire.

2. The semiconductor package of claim 1,
wherein the outer wire includes at least two first unit outer wires vertically staked over one another, and
wherein each of the at least two first unit outer wires includes the first segment and the second segment, wherein the first segment is in contact with the second segment to form an acute angle adjacent to a point at which the first and second segments intersect.

3. The semiconductor package of claim 2,
wherein the at least two first unit outer wires are arranged along a vertical direction and are space apart from each other in the vertical direction.

4. The semiconductor package of claim 1,
wherein the first segment of the first unit outer wire and the third segment of the second unit outer wire have a negative (−) slope and the second segment of the first unit outer wire and the fourth segment of the second unit outer wire have a positive (+) slope.

5. A semiconductor package comprising:
a chip stack mounted over a package substrate;
a first wire disposed over the package substrate; and
a molding layer surrounding the chip stack and the first wire,
wherein the first wire has a zigzag form,
wherein the first wire includes a plurality of unit wires arranged along a vertical direction, and
wherein each of the plurality of unit wires includes two diagonal shaped segments having a positive (+) slope and a negative (−) slope.

6. The semiconductor package of claim 5,
wherein the plurality of unit wires are arranged to be spaced apart from each other in the vertical direction.

7. The semiconductor package of claim 5,
wherein side ends of the plurality of the unit wires are exposed on a side surface of the molding layer.

8. The semiconductor package of claim 5,
wherein a top end of the first wire is exposed on a top surface of the molding layer.

9. The semiconductor package of claim 5,
wherein the package substrate includes a chip area and a peripheral area surrounding the chip area,
wherein the chip stack is disposed in the chip area, and
wherein the first wire is disposed in the peripheral area.

10. The semiconductor package of claim 9, further comprising:
a second wire over the package substrate,
wherein the second wire vertically uprightly erects from a top surface of the package substrate.

11. The semiconductor package of claim 10,
wherein the peripheral area includes an inner peripheral area and an outer peripheral area surrounding the inner peripheral area,
wherein the first wire is disposed in the outer peripheral area, and
wherein the second wire is disposed in the inner peripheral area.

12. The semiconductor package of claim 10,
wherein a top end of the second wire is exposed on a top surface of the molding layer.

13. The semiconductor package of claim 10,
wherein the package substrate further includes a substrate via and a substrate interconnection electrically connected to the second wire.

14. The semiconductor package of claim 5, further comprising:
a thermal interface material layer disposed over a top surface of the molding layer and a heat sink disposed over the thermal interface material layer,
wherein the thermal interface material layer is in contact with a top end of the first wire.

15. The semiconductor package of claim 5, further comprising:

a shield layer formed over a top surface and a side surface of the molding layer, wherein the shield layer is in contact with a side end of the first wire.

16. A semiconductor package comprising:
a chip stack mounted over a package substrate;
a first wire disposed over the package substrate;
a molding layer surrounding the chip stack and the first wire; and a first wire pad,
wherein the peripheral area includes an inner peripheral area and an outer peripheral area surrounding the inner peripheral area,
wherein the first wire pad is disposed in the outer peripheral area,
wherein the first wire is disposed over the first wire pad,
wherein a side surface of the first wire pad is exposed on a side surface of the molding layer.

17. The semiconductor package of claim 16,
wherein the side surface of the first wire pad and the side surface of the molding layer are vertically co-planar.

* * * * *